(12) United States Patent
Heinrich et al.

(10) Patent No.: US 10,707,158 B2
(45) Date of Patent: Jul. 7, 2020

(54) PACKAGE WITH VERTICAL INTERCONNECT BETWEEN CARRIER AND CLIP

(71) Applicant: Infineon Technologies AG, Neubiberg (DE)

(72) Inventors: Alexander Heinrich, Bad Abbach (DE); Bernd Goller, Otterfing (DE); Thorsten Meyer, Regensburg (DE); Gerald Ofner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/497,267

(22) Filed: Apr. 26, 2017

(65) Prior Publication Data

US 2017/0317016 A1    Nov. 2, 2017

(30) Foreign Application Priority Data

Apr. 27, 2016   (DE) .................... 10 2016 107 792

(51) Int. Cl.
*H01L 23/498*   (2006.01)
*H01L 23/00*    (2006.01)
(Continued)

(52) U.S. Cl.
CPC .... *H01L 23/49811* (2013.01); *H01L 21/4832* (2013.01); *H01L 21/563* (2013.01); *H01L 23/3157* (2013.01); *H01L 23/4952* (2013.01); *H01L 23/49524* (2013.01); *H01L 23/49562* (2013.01); *H01L 24/08* (2013.01); *H01L 24/35* (2013.01); *H01L 24/37* (2013.01); *H01L 24/40* (2013.01); *H01L 24/73* (2013.01);
(Continued)

(58) Field of Classification Search
CPC . H01L 23/49811; H01L 24/08; H01L 21/563; H01L 23/3157; H01L 21/561; H01L 24/89; H01L 24/97; H01L 2224/08245; H01L 2224/80203
See application file for complete search history.

(56) References Cited

U.S. PATENT DOCUMENTS 6,278,184 B1 *  8/2001  Brofman .............. B23K 1/0016
                                                257/737
7,663,211 B2    2/2010  Noquil et al.
(Continued)

FOREIGN PATENT DOCUMENTS

DE    102009005650 A1    8/2009
DE    102014117762 A1    6/2015
(Continued)

OTHER PUBLICATIONS

"SOD323-FL (Flat Lead) Power Discrete"; Publication Date: Feb. 5, 2016 (Browser Search Date); Author: AMKOR Technology; http://www.amkor.com/go/packaging/all-packages/sod323/sod323-fl-flat-lead-power-discrete.
(Continued)

*Primary Examiner* — Su C Kim

(57) ABSTRACT

A package comprising a chip carrier, an electronic chip on the chip carrier, a clip on the electronic chip, an encapsulant at least partially encapsulating the electronic chip, and an electrically conductive vertical connection structure provided separately from the clip and electrically connecting the chip carrier with the clip.

20 Claims, 17 Drawing Sheets

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC .............. *H01L 24/84* (2013.01); *H01L 24/89* (2013.01); *H01L 24/92* (2013.01); *H01L 24/97* (2013.01); *H01L 21/561* (2013.01); *H01L 23/3107* (2013.01); *H01L 24/32* (2013.01); *H01L 24/83* (2013.01); *H01L 2224/08245* (2013.01); *H01L 2224/32245* (2013.01); *H01L 2224/352* (2013.01); *H01L 2224/376* (2013.01); *H01L 2224/3756* (2013.01); *H01L 2224/37147* (2013.01); *H01L 2224/4048* (2013.01); *H01L 2224/40245* (2013.01); *H01L 2224/40499* (2013.01); *H01L 2224/73263* (2013.01); *H01L 2224/80203* (2013.01); *H01L 2224/8384* (2013.01); *H01L 2224/83191* (2013.01); *H01L 2224/83192* (2013.01); *H01L 2224/83203* (2013.01); *H01L 2224/83447* (2013.01); *H01L 2224/83825* (2013.01); *H01L 2224/8484* (2013.01); *H01L 2224/84203* (2013.01); *H01L 2224/84825* (2013.01); *H01L 2224/84947* (2013.01); *H01L 2224/92* (2013.01); *H01L 2224/921* (2013.01); *H01L 2224/9221* (2013.01); *H01L 2224/97* (2013.01); *H01L 2924/181* (2013.01)

(56) References Cited

U.S. PATENT DOCUMENTS

| | | | |
|---|---|---|---|
| 8,058,107 B2 | 11/2011 | Cruz | |
| 8,193,618 B2 | 6/2012 | Madrid | |
| 8,193,622 B2 | 6/2012 | Madrid | |
| 8,304,903 B2 | 11/2012 | Herbsommer et al. | |
| 8,680,668 B2 | 3/2014 | Meyer-Berg et al. | |
| 8,877,564 B2 | 11/2014 | Cruz et al. | |
| 8,883,567 B2 | 11/2014 | Wyant et al. | |
| 8,969,137 B2 | 3/2015 | Cruz et al. | |
| 8,987,051 B2 | 3/2015 | Cho | |
| 9,230,949 B2 | 1/2016 | Zhang et al. | |
| 2003/0075785 A1* | 4/2003 | Crowley | H01L 23/49513 257/676 |
| 2005/0161785 A1 | 7/2005 | Kawashima et al. | |
| 2007/0096270 A1 | 5/2007 | Pavier | |
| 2010/0314780 A1* | 12/2010 | Camacho | H01L 21/561 257/777 |
| 2011/0156264 A1* | 6/2011 | Machida | H01L 21/4846 257/773 |
| 2011/0260339 A1* | 10/2011 | Miki | H01L 23/16 257/779 |
| 2012/0032340 A1* | 2/2012 | Choi | H01L 21/561 257/774 |
| 2012/0038053 A1* | 2/2012 | Oh | H01L 21/561 257/773 |
| 2013/0249069 A1 | 9/2013 | Hosseini et al. | |
| 2013/0284509 A1* | 10/2013 | Murayama | H01R 4/02 174/267 |
| 2013/0329365 A1* | 12/2013 | Hosseini | F28D 15/02 361/699 |
| 2014/0001480 A1 | 1/2014 | Otremba et al. | |
| 2014/0077362 A1* | 3/2014 | Lin | H01L 21/486 257/737 |
| 2014/0182912 A1* | 7/2014 | Lin | H01L 23/49811 174/261 |
| 2014/0210109 A1* | 7/2014 | Tanaka | H01L 23/145 257/778 |
| 2015/0187720 A1* | 7/2015 | Watanabe | H01L 24/81 257/738 |
| 2015/0228571 A1* | 8/2015 | Shiraki | H01L 23/49838 257/701 |
| 2015/0270237 A1 | 9/2015 | Chi et al. | |
| 2015/0325559 A1 | 11/2015 | Niu et al. | |
| 2015/0380384 A1 | 12/2015 | Williams et al. | |
| 2016/0099232 A1* | 4/2016 | Hatori | H01L 25/0657 257/778 |

FOREIGN PATENT DOCUMENTS

| | | |
|---|---|---|
| DE | 102015115999 A1 | 3/2016 |
| EP | 0084464 A2 | 7/1983 |
| JP | 2001298142 A | 10/2001 |

OTHER PUBLICATIONS

"Bonding on High-power Modules"; Publication Date: Feb. 5, 2016 (Browser Search Date); Author: Albert Heilmann | Umicore | Stefan Strixner | Zestron; http://electroiq.com/blog/2007/05/clip-bonding-on-high-power-modules/http://electroiq.com/blog/2007/05/clip-bonding-on-high-power-modules/.

"Special Tutorial Series: Fabricating Overmolded QFN Packages"; Publication: 2011; Author: Richard Otte | Chris Pugh; http://www.promex-ind.com/kc_documents/kc_talks_papers/qfn_article_series_taptimes.pdf.

English language translation of Abstracts for DE 102014117762 A1, JP 2001298142 A, DE 102015115999 A1 and DE 102009005650 A1.

* cited by examiner

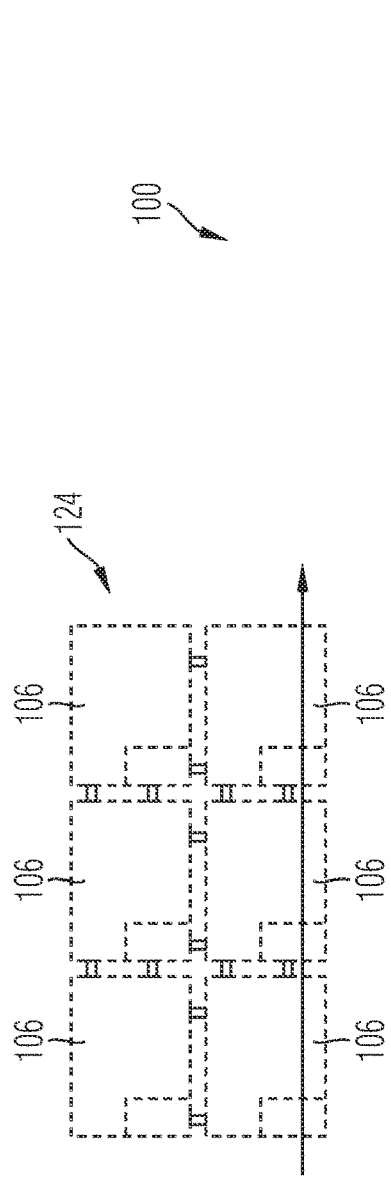
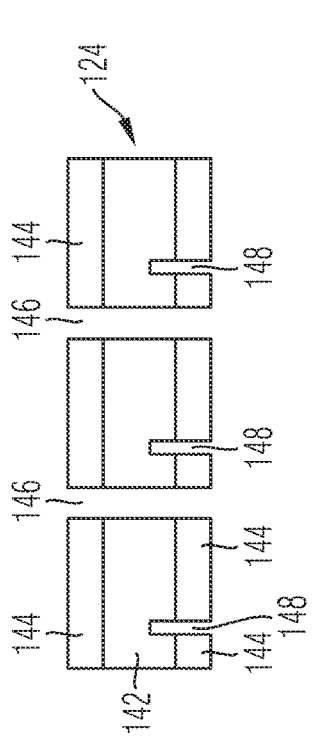
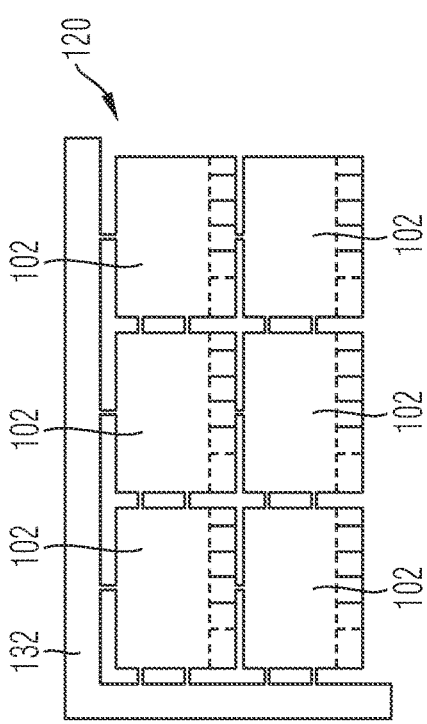
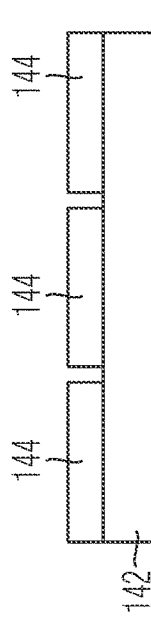
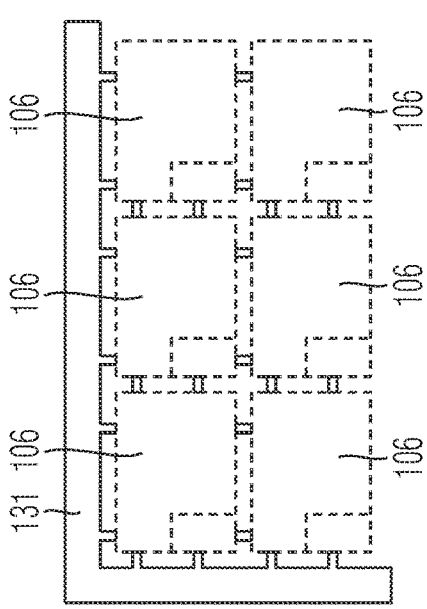

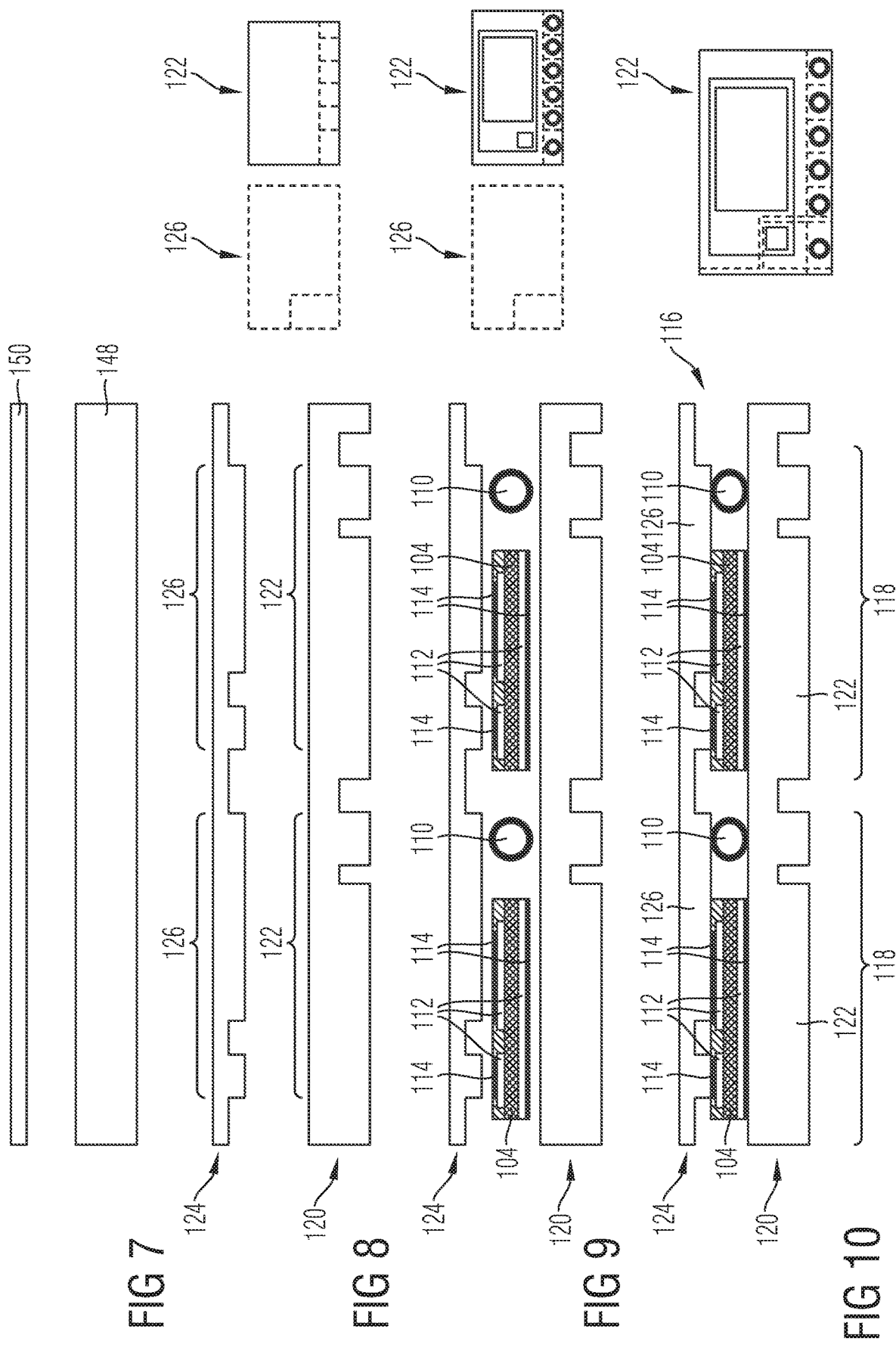

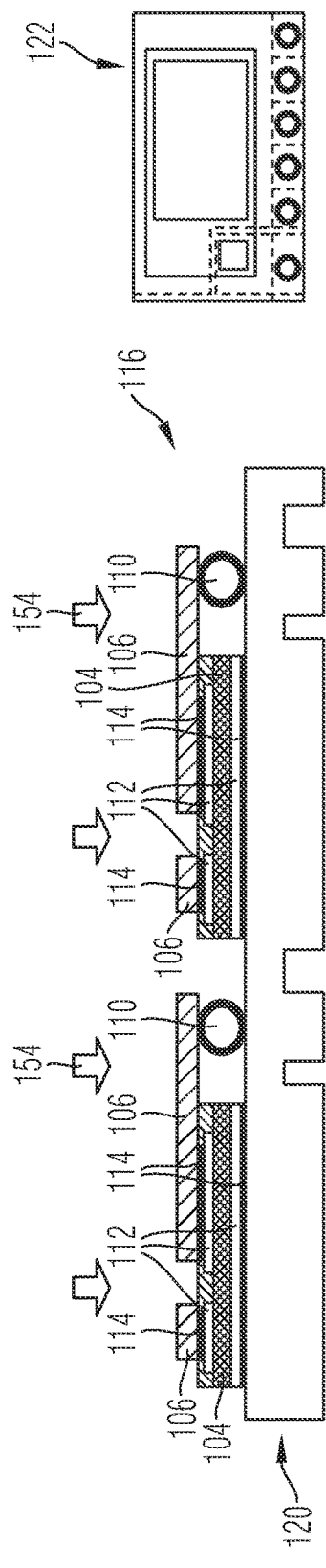
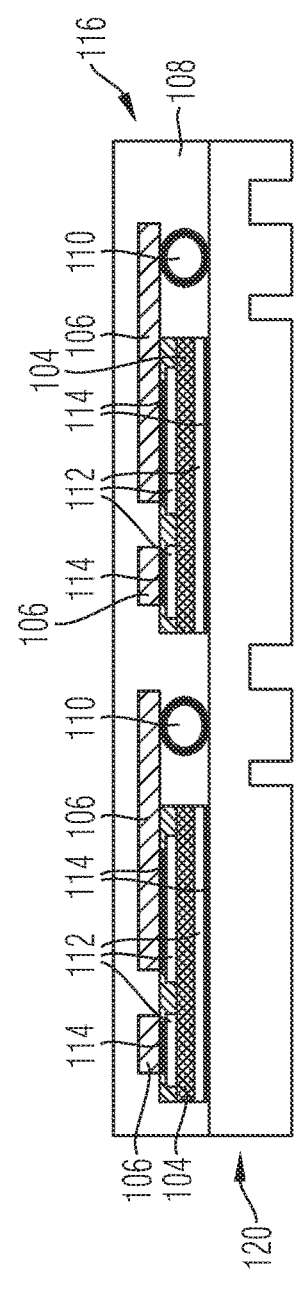
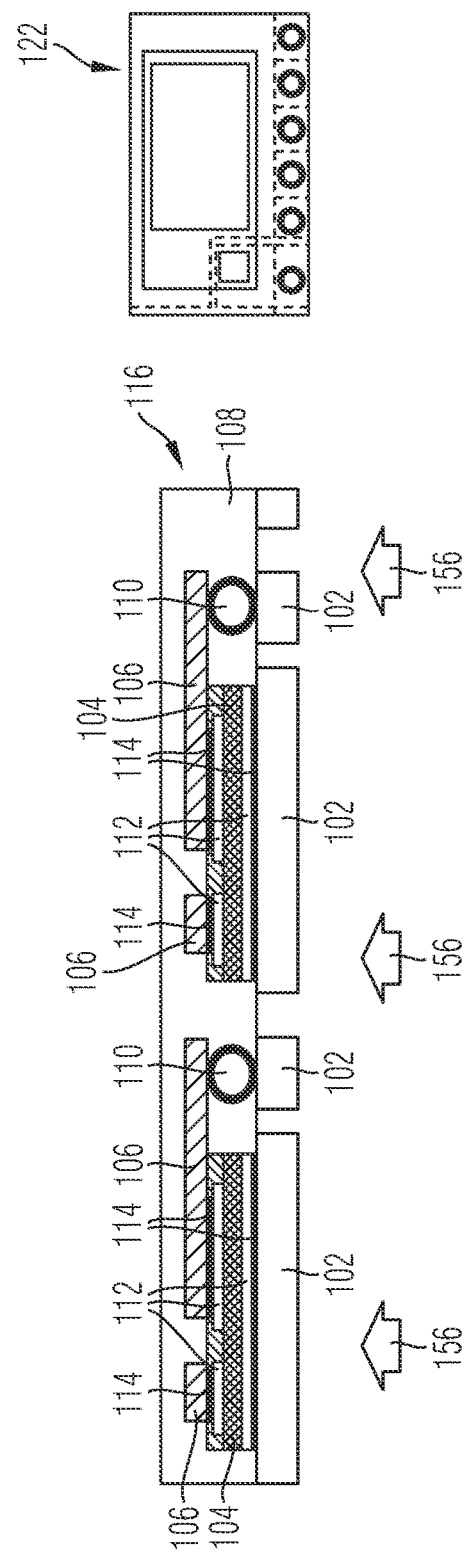
FIG 11
FIG 12
FIG 13

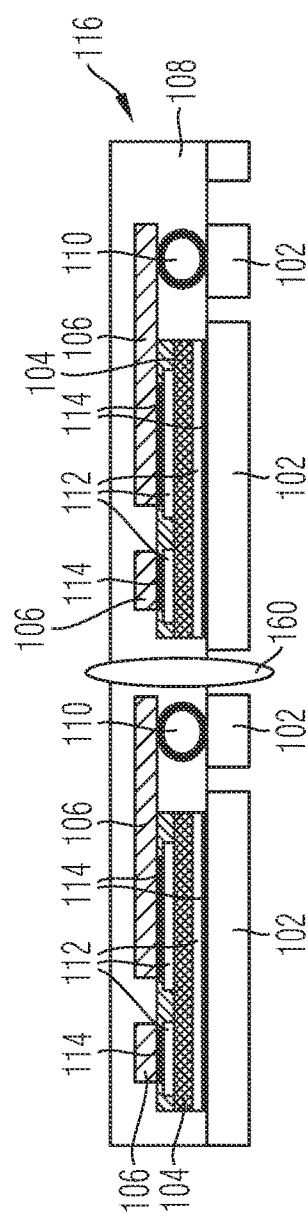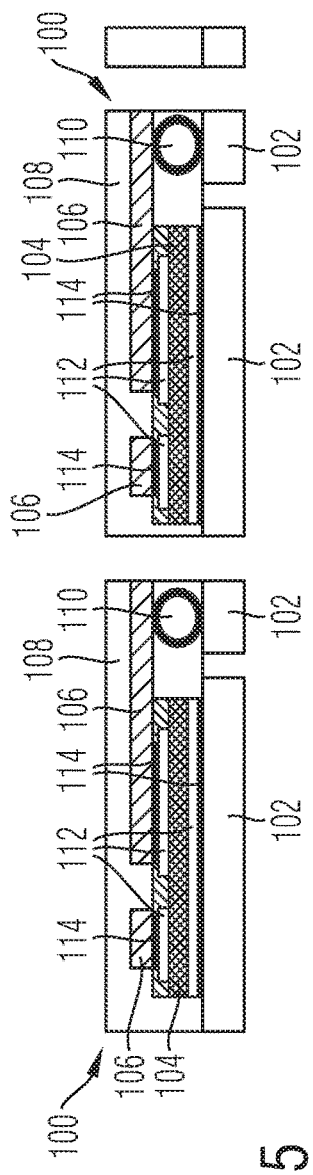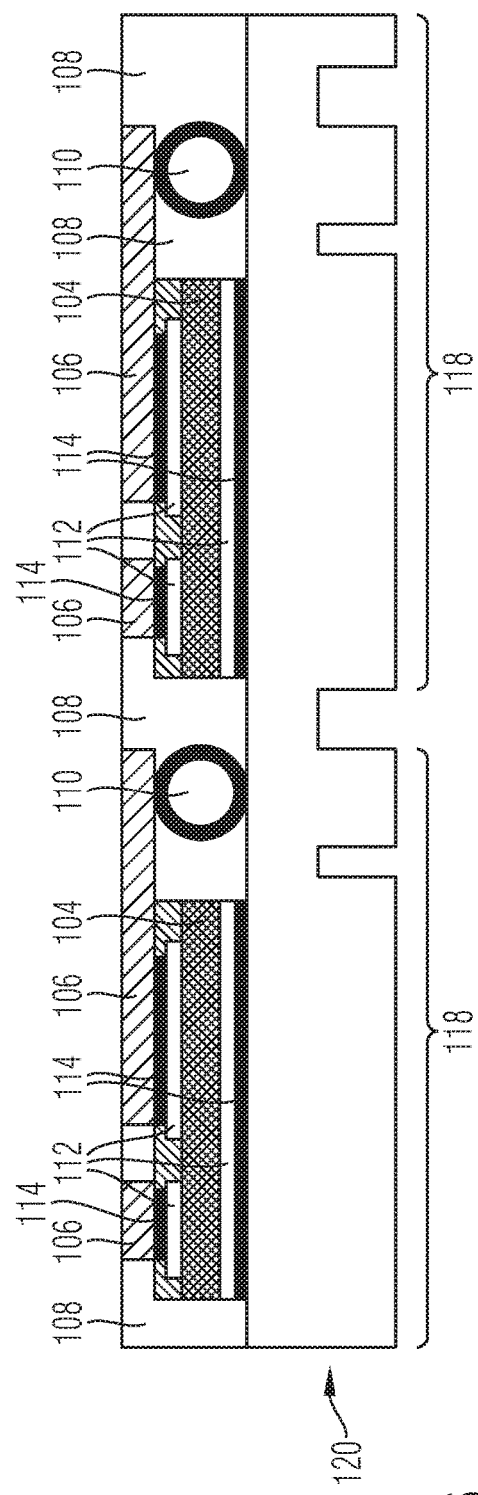

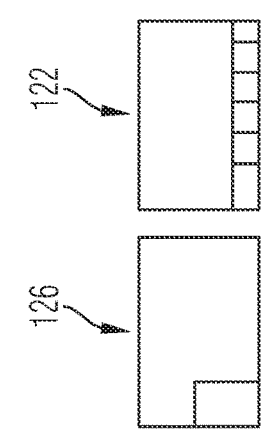
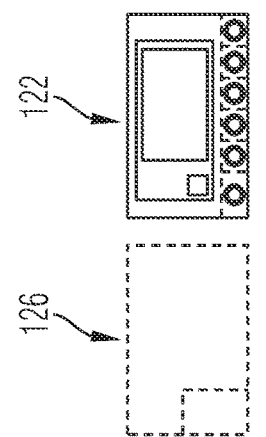
FIG 17
FIG 18

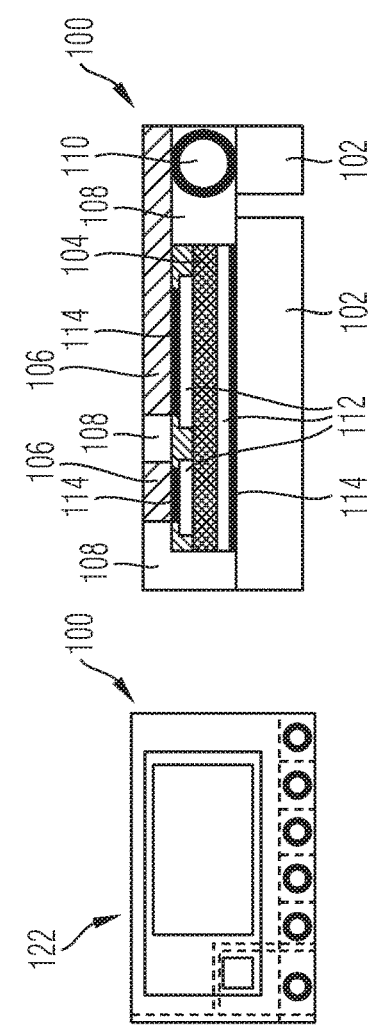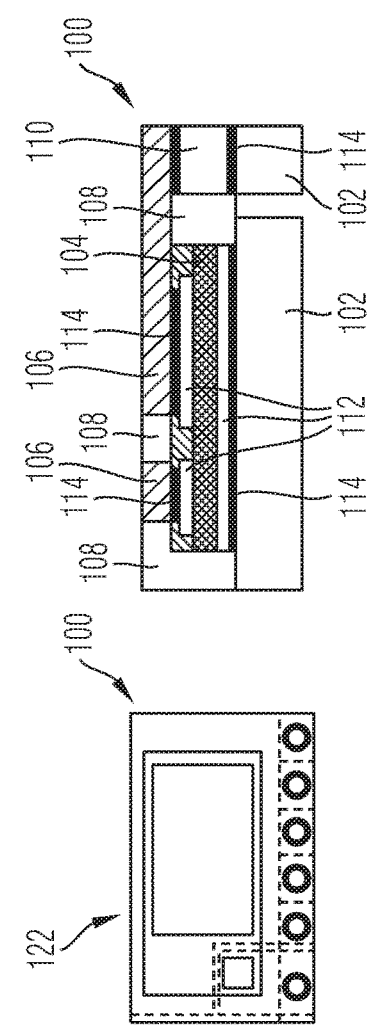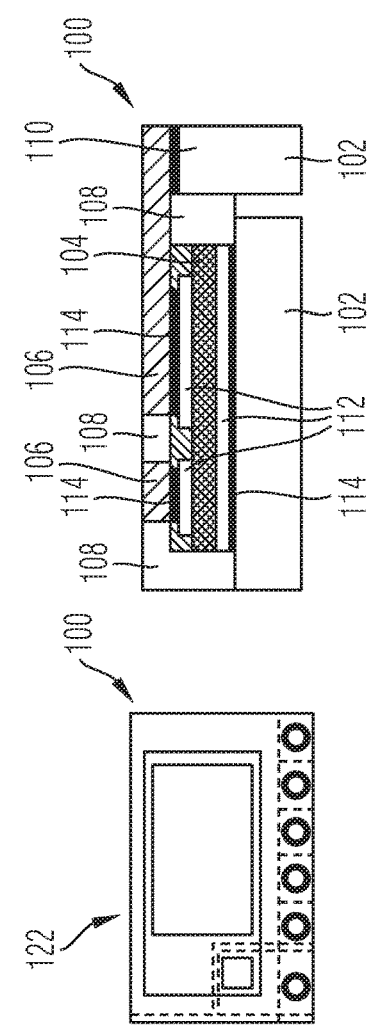

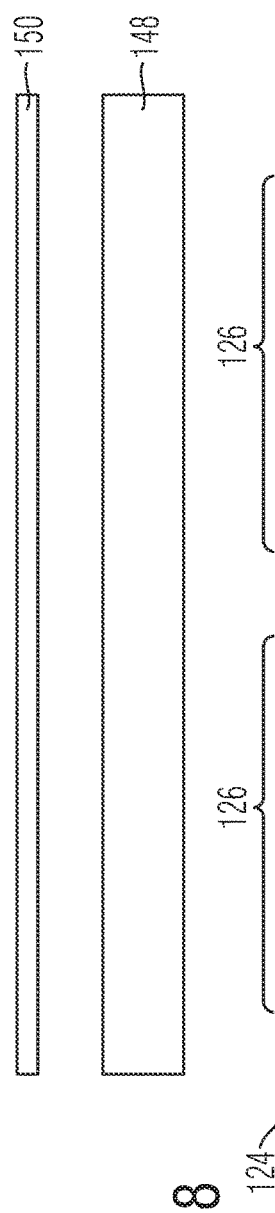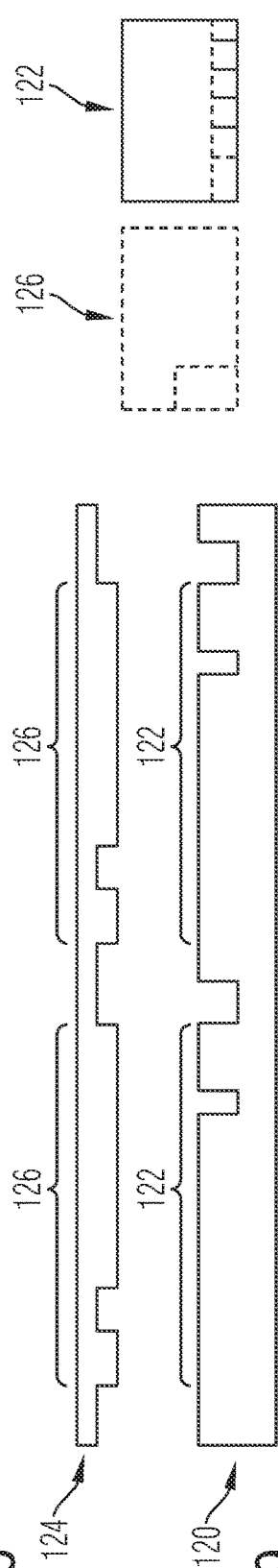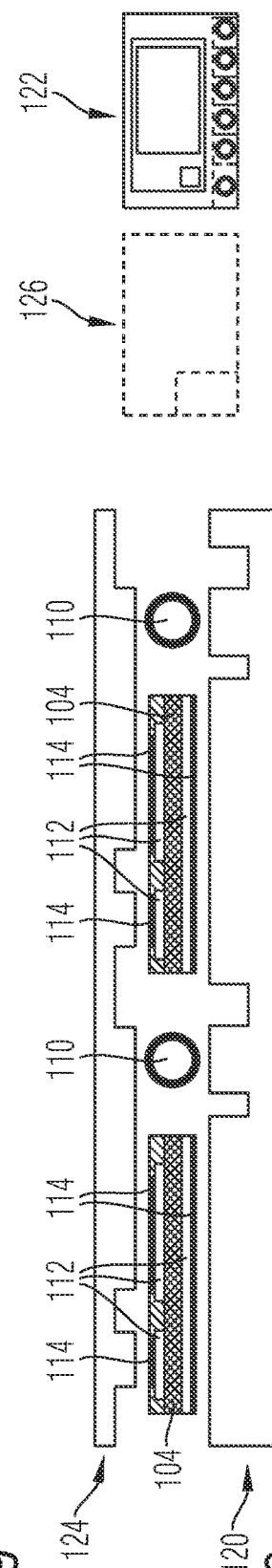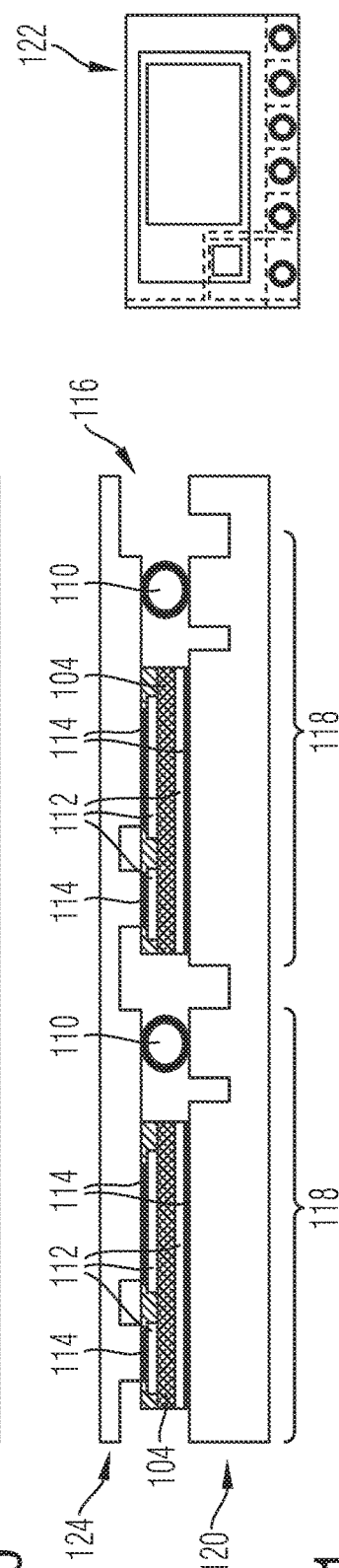

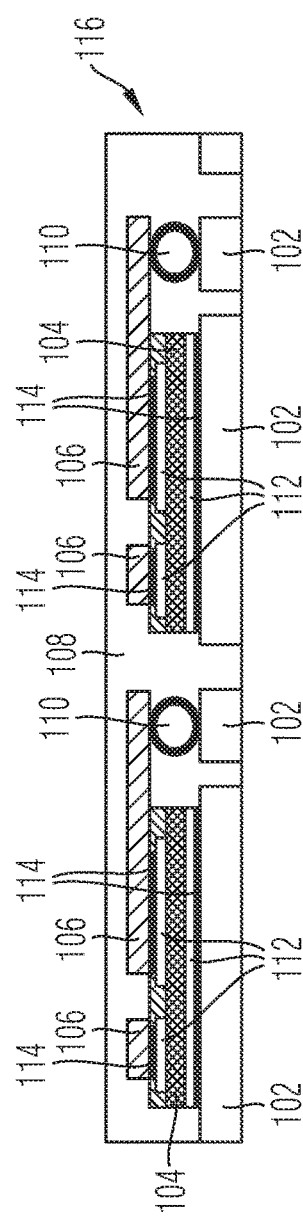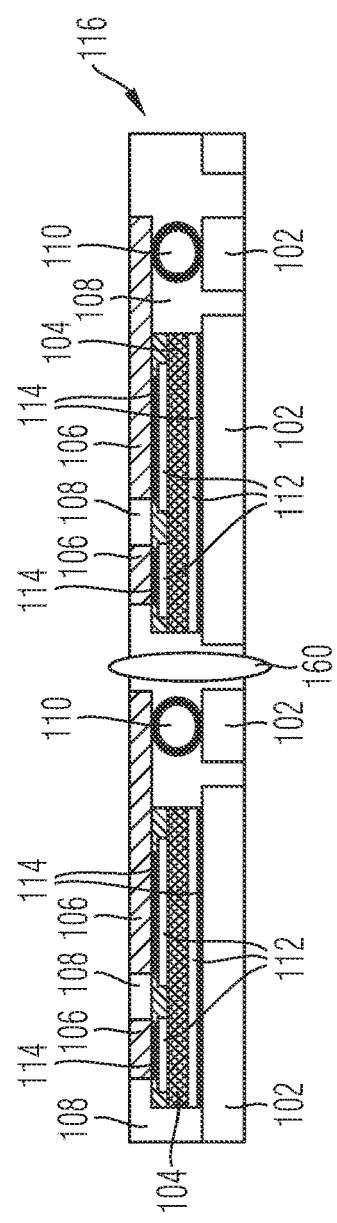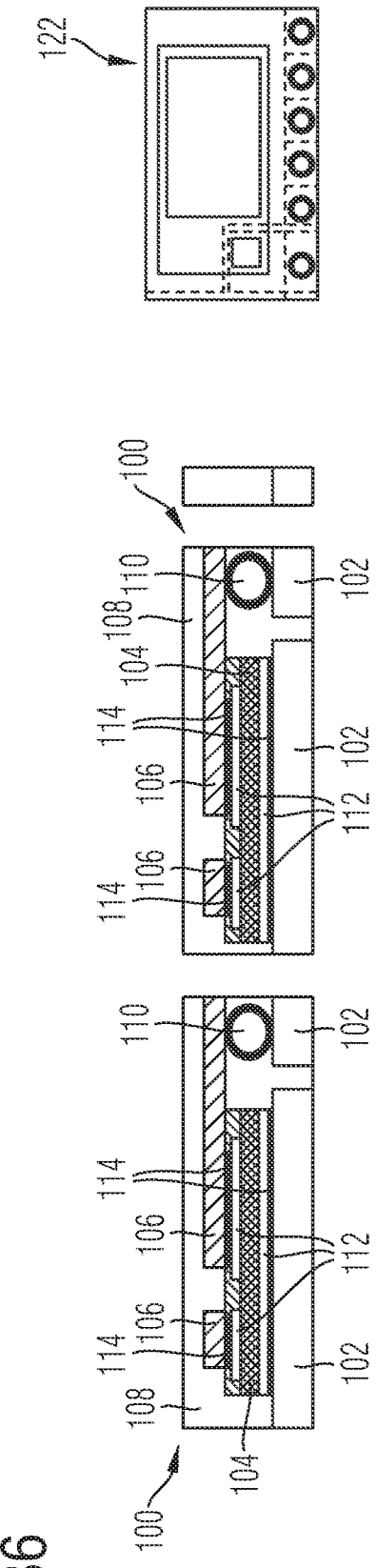

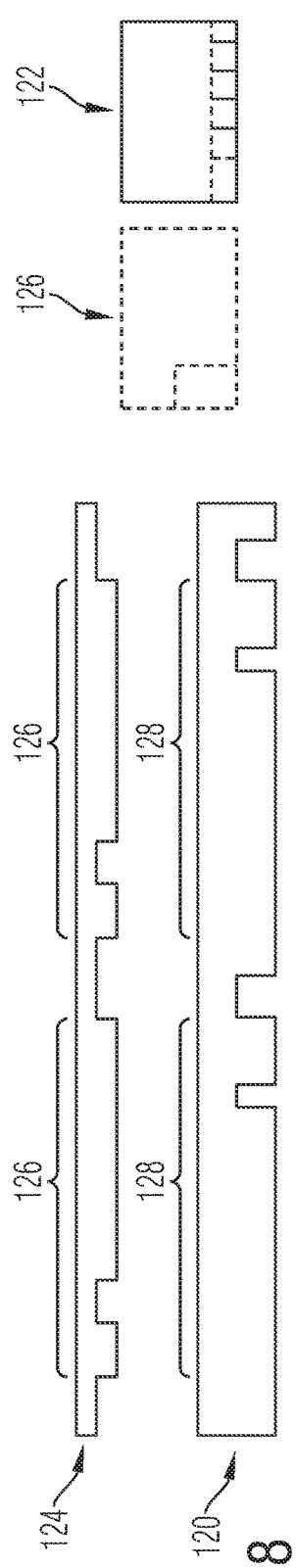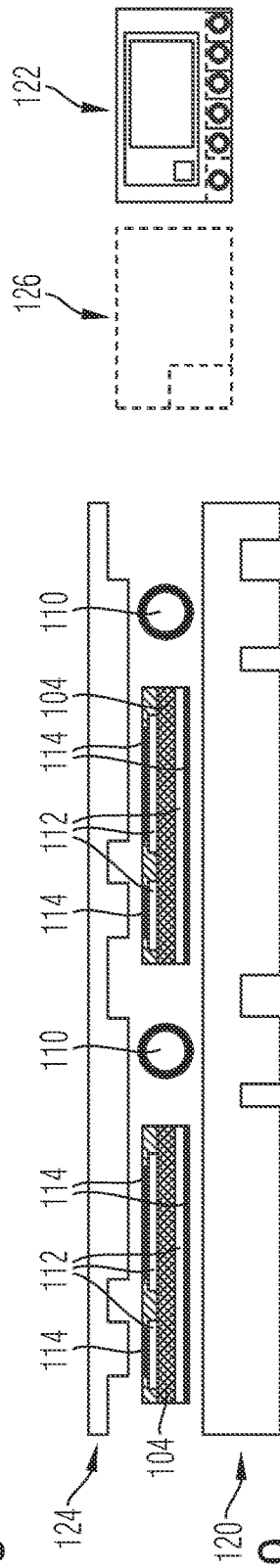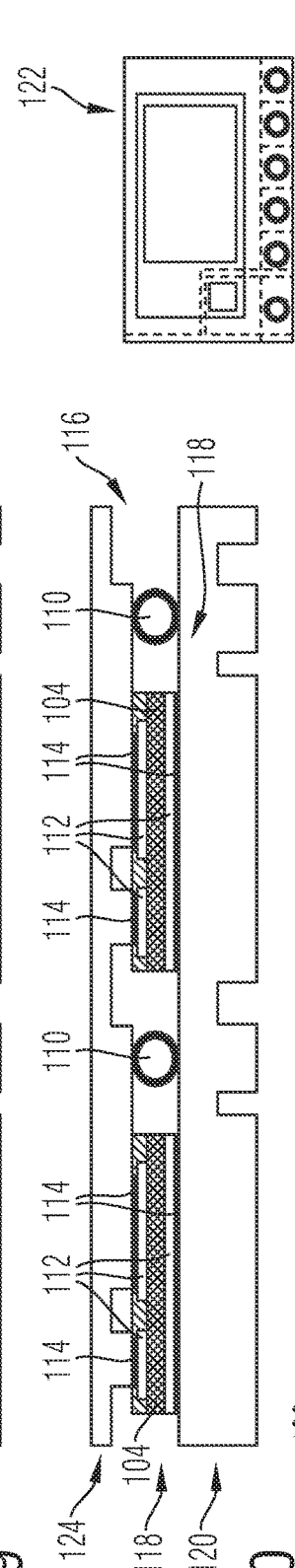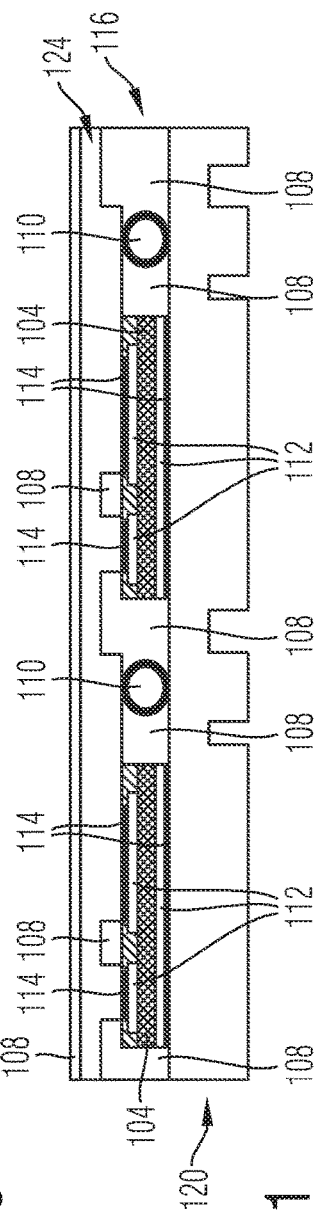

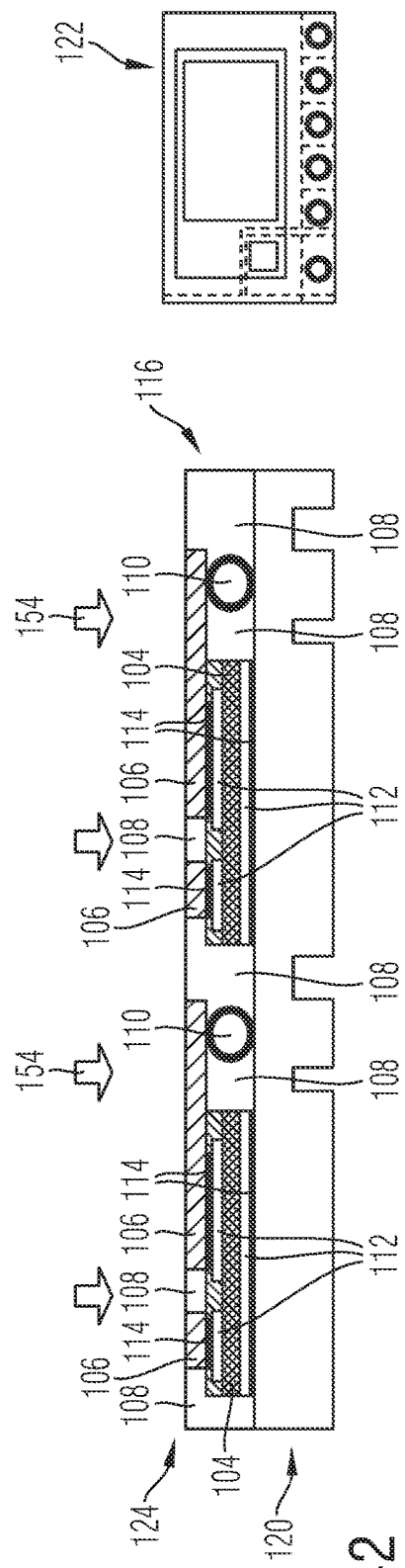
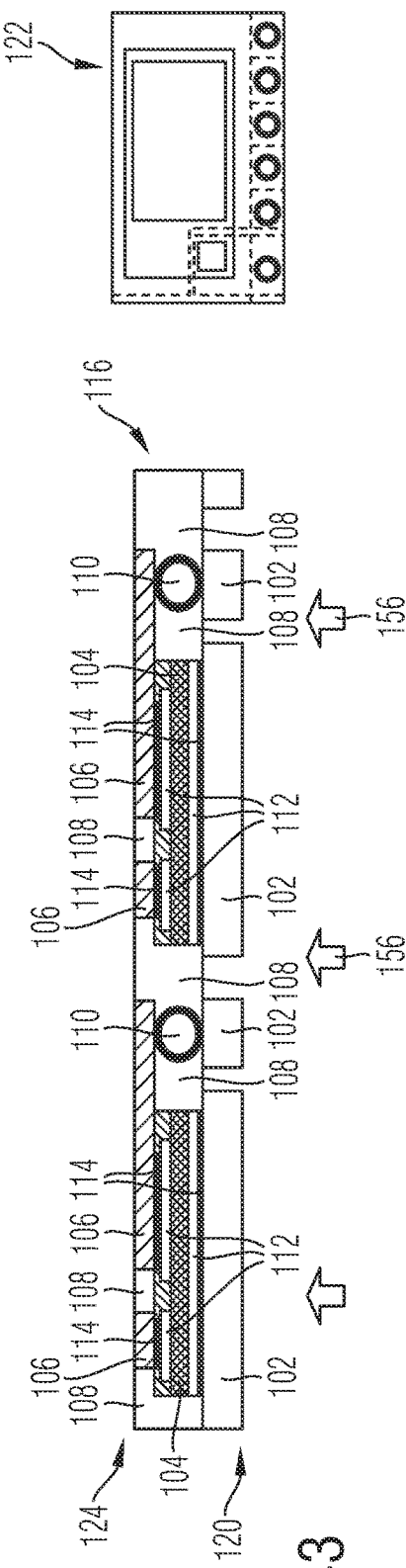
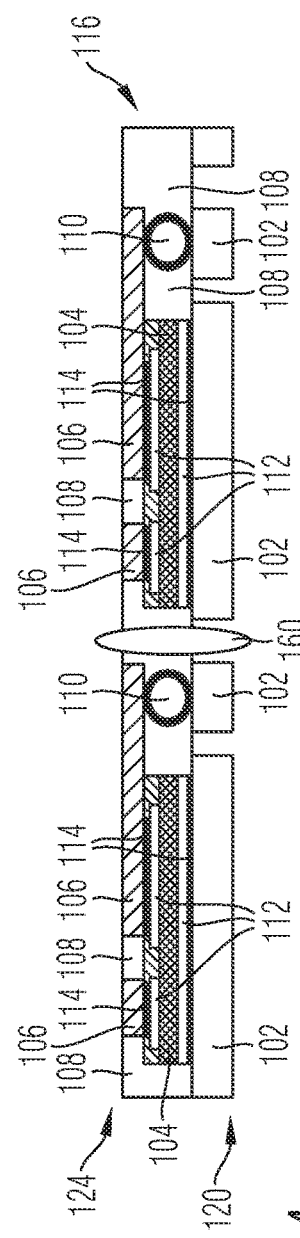
FIG 42
FIG 43
FIG 44

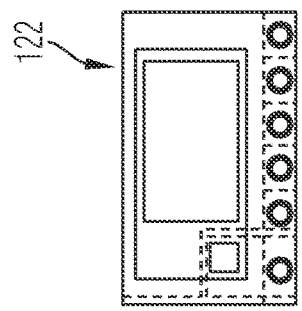
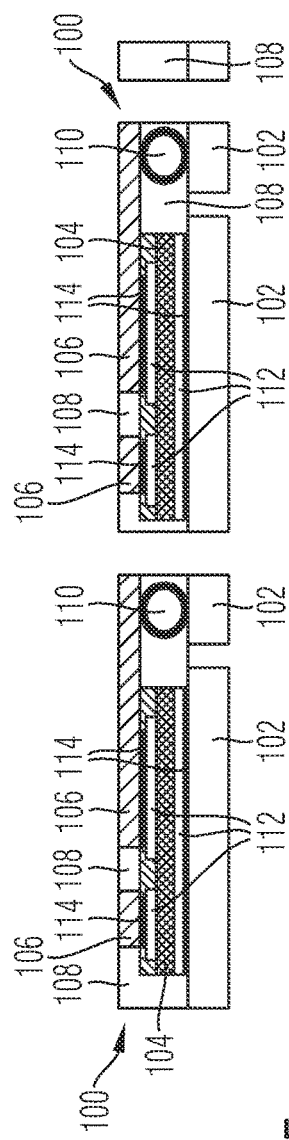
FIG 45
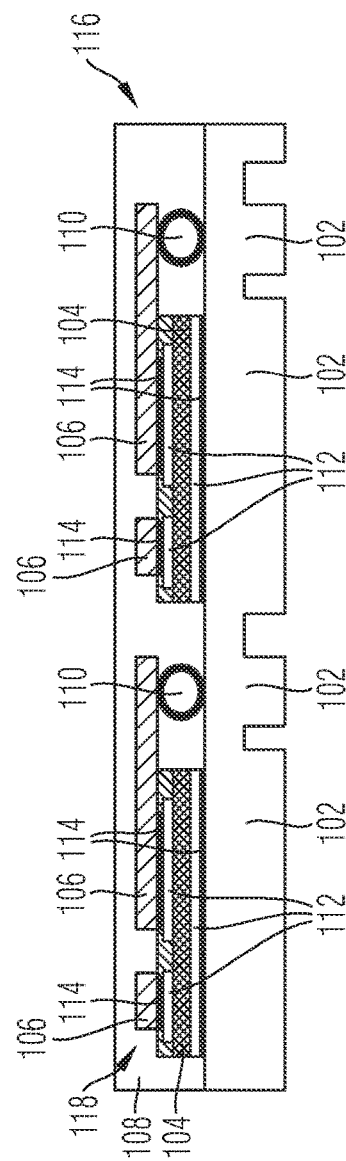
FIG 46
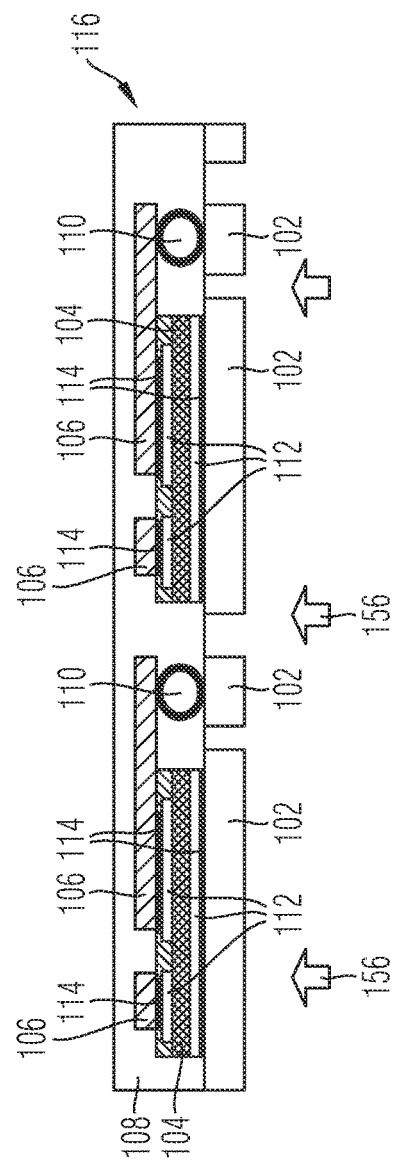
FIG 47

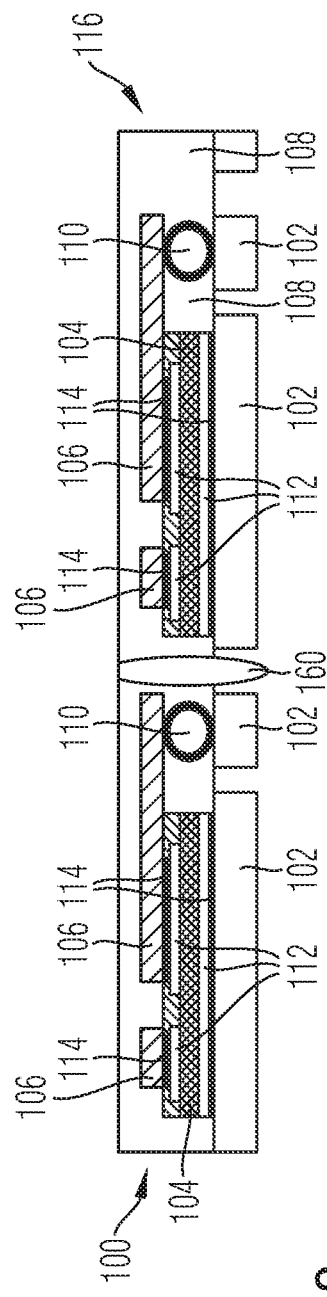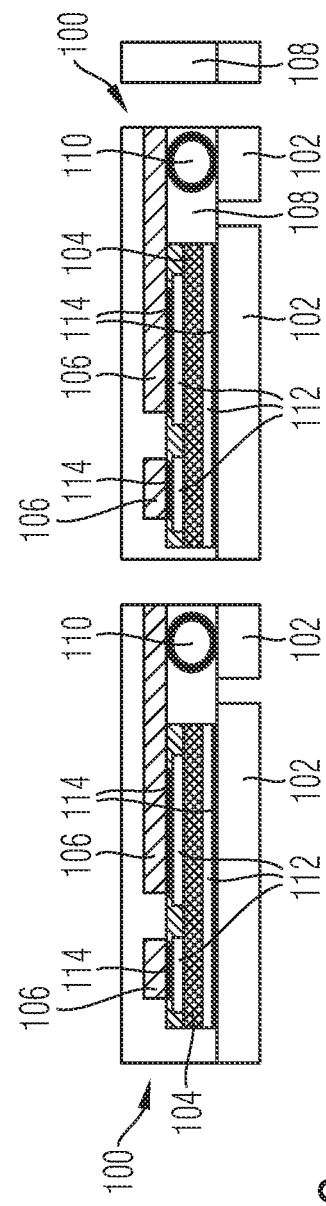

PACKAGE WITH VERTICAL INTERCONNECT BETWEEN CARRIER AND CLIP

BACKGROUND OF THE INVENTION

Field of the Invention

The present invention relates to a package, a semifinished product, a method of manufacturing a package, and a method of manufacturing a batch of packages.

Description of the Related Art

Packages may be denoted as encapsulated electronic chips with electrical connects extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application. There are applications, where high performance is required, others, where reliability is the top priority—but all requires lowest possible cost.

SUMMARY OF THE INVENTION

There may be a need to manufacture electronic components in a simple and reliable manner.

According to an exemplary embodiment, a package is provided which comprises a chip carrier, an electronic chip on the chip carrier, a clip on the electronic chip, an encapsulant at least partially encapsulating the electronic chip, and an electrically conductive vertical connection structure provided separately from the clip and electrically connecting the chip carrier with the clip.

According to another exemplary embodiment, a semifinished product composed of a plurality of preforms of packages is provided, wherein the semifinished product comprises a batch carrier comprising a plurality of chip carrier sections, a plurality of electronic chips arranged on the batch carrier so that each of the electronic chips is assigned to a respective one of the chip carrier sections, a batch clip comprising a plurality of clip sections and being arranged on the electronic chips so that each of the electronic chips is assigned to a respective one of the clip sections, and a plurality of electrically conductive vertical connection structures provided separately from the batch clip, wherein each of the connection structures electrically connects a respective one of the chip carrier sections with a respective one of the clip sections.

According to yet another exemplary embodiment, a method of manufacturing a package is provided, wherein the method comprises mounting an electronic chip on a chip carrier, mounting a clip on the electronic chip, electrically connecting the chip carrier with the clip by an electrically conductive vertical connection structure provided separately from the clip, and at least partially encapsulating the electronic chip by an encapsulant.

According to yet another exemplary embodiment, a method of manufacturing a batch of packages is provided, wherein the method comprises providing a batch carrier comprising a plurality of chip carrier sections, arranging a plurality of electronic chips on the batch carrier so that each of the electronic chips is assigned to a respective one of the chip carrier sections, arranging a batch clip, which comprises a plurality of clip sections, on the electronic chips so that each of the electronic chips is assigned to a respective one of the clip sections, providing a plurality of electrically conductive vertical connection structures separately from the batch clip, and electrically connecting each of the connection structures between a respective one of the chip carrier sections and a respective one of the clip sections.

According to an exemplary embodiment of the invention, a packaging architecture is provided which can be universally implemented for many different geometries and which is highly compatible with an efficient batch manufacturing procedure. A corresponding package may sandwich an electronic chip between a chip carrier and a clip, wherein void spaces or gaps may be at least partially filled by an encapsulant. An electric connection between the chip carrier and the clip may be accomplished by a separate contact structure being either a completely separate body or forming part of the carrier. By taking this measure, proper electric coupling and reliable packaging may be combined with a very simple clip geometry, since a substantially two-dimensional or simply profiled clip may be implemented rather than a complex three-dimensionally bent clip structure. This makes it possible to manufacture the packages in a batch procedure on the basis of a batch carrier and a batch clip with simple construction, being singularized into the chip carriers (or chip carrier sections) and clips (or clip sections) in a readily finished package.

DESCRIPTION OF FURTHER EXEMPLARY EMBODIMENTS

In the following, further exemplary embodiments of the package, the semifinished product, and the methods will be explained.

In the context of the present application, the term "package" may particularly denote at least one at least partially encapsulated electronic chip with at least one external electric contact.

The term "electronic chip" may particularly denote a semiconductor chip having at least one integrated circuit element (such as a diode or a transistor) in a surface portion thereof. The electronic chip may be a naked die or may be already packaged or encapsulated.

In the context of the present application, the term "encapsulant" may particularly denote a substantially electrically insulating and preferably thermally conductive material surrounding (preferably hermetically surrounding) an electronic chip and part of a chip carrier to provide mechanical protection, electrical insulation, and optionally a contribution to heat removal during operation. Such an encapsulant can be, for example, a mold compound or a laminate.

In an embodiment, the connection structure is provided separately from the chip carrier. In such an embodiment, a completely separate connection structure may be used which allows a simplified construction of both batch carrier and batch clip.

In another embodiment, the connection structure forms an integral part of the chip carrier. In particular, the connection structure may be embodied as a protrusion of the chip carrier extending in parallel to the electronic chip up to the clip. This keeps the number of pieces to be handled small and the manufacturing procedure simple. In such an embodiment, the connection structure on the chip carrier may be formed by half etching.

In an embodiment, the batch clip has a profiled surface facing the electronic chip and has an opposing planar surface. With this profile facing towards an interior of the package, singularization of the batch clip into a plurality of individual clips is easily possible by grinding or etching.

In an embodiment, the batch carrier has a profiled surface and has an opposing planar surface. The profiled surface may be directed outwardly or towards the electronic chip. In the former case, singularization of the batch carrier into a plurality of individual chip carriers may be possible by etching, in the latter case also by grinding.

In an embodiment, the chip carrier is an electrically conductive chip carrier (for instance made of copper), in particular a leadframe. A leadframe may be a metal structure inside a chip package that is configured for carrying signals from the electronic chip to the outside, and/or vice versa. The electronic chip inside the package may be attached to the leadframe for establishing an electric connection between the electronic chip and leads of the leadframe. Subsequently, the leadframe may be molded in a plastic case or any other encapsulant.

In an embodiment, the connection structure comprises at least one of the group consisting of at least one bead (or ball) with electrically conductive core and solderable shell, an electrically conductive block (such as a copper block), a solderable body (such as a solder pump), a through silicon via (for instance made of copper), and a piece of a printed circuit board (or an interposer). A preferred embodiment is the implementation of a ball or bead (such as a sphere) with core (for instance of copper or nickel) and shell (for instance made of tin). Such a configuration may hence involve a copper core ball or a nickel core ball.

In an embodiment, the electronic chip and the connection structure are arranged side by side between the chip carrier and the clip. Hence, the electronic chip and the connection structure may be juxtaposed rather than being provided on top of one another. This provides for a compact package which can be properly manufactured in a batch procedure.

In an embodiment, the electronic chip is electrically connected to at least one of the chip carrier and the clip. When the electronic chip has one active region only, an electric connection on a corresponding chip surface to the clip or the carrier is sufficient. When the electronic chip has two active regions (as it is the case in certain power semiconductor chips), an electric connection on a corresponding chip surface to the clip and the carrier can be established.

In an embodiment, the electronic chip has at least one chip pad on a first main surface facing the chip carrier and has at least one further chip pad on a second main surface facing the clip. For instance, one main surface may have two chip pads, whereas the opposing other main surface may have one chip pad (for instance in case of a chip).

In an embodiment, at least one chip pad of the electronic chip is covered with a solderable interconnect, in particular at least one of a diffusion solder material and a sintering paste. Thus, a solder connection between a respective chip pad and a chip carrier and/or a clip can be established by a corresponding solderable interconnect, for instance made of tin. It is possible to either provide the solderable interconnect on the chip side (see for example FIG. 9) or on the clip side (see for example FIG. 17 or FIG. 19). Hence, the manufacturing method may connect the electronic chip and the clip by soldering the solderable interconnect, covering one of the electronic chip and the clip, between the electronic chip and the clip.

In an embodiment, both the chip carrier and the clip have at least a surface portion exposed with regard to the encapsulant. In such an embodiment, double-sided cooling (i.e. via the chip carrier and via the clip) is possible, which allows for a particularly efficient removal of heat generated by the electronic chip during operation of the package.

In an embodiment, at least one of the chip carrier and the clip comprises or consists of electrically conductive material, in particular copper. This may be advantageous in terms of establishing electric connections and removing heat.

In an embodiment, the electronic chip is electrically connected to at least one of the chip carrier and the clip. Thus, the described packaging concept may electrically couple one or more pads on one main surface of the electronic chip with the clip, one or more pads on an opposing another main surface of the electronic chip with the chip carrier, and additionally the chip carrier with the clip via the connection structure.

In an embodiment, the batch clip is configured as a substantially two-dimensional electrically conductive sheet, in particular being free of undercuts. In this context, the term "two-dimensional electrically conductive sheet" may particularly denote a batch clip being formed on the basis of a metal foil or the like which may only include a simply manufacturable surface profile. In contrast to this, the batch clip may be free of undercuts, cantilevers or other complex three-dimensional structures. This makes it possible to carry out a batch manufacture with large formats of batch clip and batch barrier (for instance 24'×18') without the risk ob substantial bending during handling. In particular, at least one of the batch carrier and the batch clip may have a dimension of at least 100 cm$^2$, in particular of at least 1000 cm$^2$. Even with these large formats, no issues concerning handling, bending, etc. arise.

In an embodiment, the connecting is accomplished by the application of at least one of mechanical pressure and heat. In particular, solder connections can be thermally established, supported by mechanical pressure.

In an embodiment, the method comprises singularizing an obtained semifinished product into singularized packages, each comprising at least one chip carrier section, at least one electronic chip, at least one clip section and at least one connection structure. This singularisation may be accomplished by mechanically dicing, alternatively by etching or laser cutting. Advantageously, the batch clip and/or the batch carrier may be configured so that and/or may be treated (for instance thinned) during the batch manufacture so that the above mentioned singularization procedure only requires removing or cutting through encapsulant (in particular mold) material rather than cutting through metallic material of clips or chip carriers (see for instance FIG. 14). This may significantly speed up and simplify the singularization procedure.

In an embodiment, at least one of the batch carrier and the clip carrier is formed by half etching an electrically conductive sheet (see for instance FIG. 3 and FIG. 4). Half etching is a simple procedure of forming blind holes rather than through holes in a metal sheet (such as a copper foil) for forming the batch carrier and the batch clip.

In an embodiment, the method comprises separating the clip sections from one another by removing, in particular by grinding or etching, material of the batch clip, in particular simultaneously with removing material of the encapsulant. This allows to transfer, with a simple and batch-type procedure, a batch clip into individual clips or clip sections.

In an embodiment, the method comprises separating the chip carrier sections from one another by removing, in particular by grinding or etching, material of the batch carrier. This allows to transfer, with a simple and batch-type procedure, a batch carrier into individual chip carriers or carrier chip sections.

In an embodiment, at least part of the removing is done after encapsulating. This preferred alternative has the advantage that the encapsulant may mechanically support the profiled metal structure (i.e. batch clip and/or batch chip) during the metal material removing procedure. Particularly during grinding, this prevents undesired damage of the batch clip and/or batch chip to be thinned for separation purposes during thinning.

In an embodiment, at least part of the removing is done before encapsulating. This may in particular be an interesting alternative for the procedure of thinning batch clip and/or batch chip by etching, since less material needs to be removed in the absence of an encapsulant.

In an embodiment, the connecting is carried out simultaneously with a further connecting between the electronic chip and at least one of the chip carrier and the clip. For instance these mechanical and electric coupling procedures may be carried out at the same time by the application of pressure and heat. This allows for a rapid and efficient manufacturing procedure.

In an embodiment, the encapsulant comprises or consists of at least one of the group consisting of a mold compound and a laminate.

In an embodiment, the encapsulant comprises a laminate, in particular a printed circuit board laminate. In the context of the present application, the term "laminate structure" may particularly denote an integral flat member formed by electrically conductive structures and/or electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives.

In another embodiment, the encapsulant comprises a mold, in particular a plastic mold. For instance, a correspondingly encapsulated chip may be provided by placing the electronic chip soldered onto the chip carrier (if desired together with other components) between an upper mold die and a lower mold die and to inject liquid mold material therein. After solidification of the mold material, the package formed by the encapsulant with the electronic chip and the chip carrier in between is completed. If desired, the mold may be filled with particles improving its properties, for instance its heat removal properties.

In an embodiment, the one or more electronic chips of a package is a/are power semiconductor chip(s). In particular for power semiconductor chips, electric reliability and mechanical integrity are important issues which can be met with the described manufacturing procedure. Possible integrated circuit elements which can be monolithically integrated in such a semiconductor power chip are field effect transistors (such as insulated gate bipolar transistors or metal oxide semiconductor field effect transistors) diodes, etc. With such constituents, it is possible to provide packages for automotive applications, high-frequency applications, etc. Examples for electric circuits which can be constituted by such and other power semiconductor circuits and packages are half-bridges, full bridges, etc.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 2 is a plan view of a batch clip according to an exemplary embodiment.

FIG. 3 is a cross-sectional view of a preform of a batch clip according to an exemplary embodiment.

FIG. 4 is a cross-sectional view of another preform of a batch clip according to an exemplary embodiment.

FIG. 5 is a plan view of a batch clip with frame structure according to an exemplary embodiment.

FIG. 6 is a plan view of a batch carrier with frame structure according to an exemplary embodiment.

FIG. 7 to FIG. 15 show structures obtained during carrying out a method of manufacturing a plurality of packages in a batch procedure according to an exemplary embodiment.

FIG. 16 show a structure obtained during carrying out a method of manufacturing a plurality of packages in a batch procedure with an additional procedure to be carried out between the stages of according to FIG. 12 and FIG. 13.

FIG. 17 and FIG. 18 shows structures obtained during carrying out a method of manufacturing a plurality of packages in a batch procedure according to yet another exemplary embodiment.

FIG. 23 to FIG. 25 illustrate cross-sectional views and plan views of packages according to exemplary embodiments.

FIG. 28 to FIG. 37 show structures obtained during carrying out a method of manufacturing a plurality of packages in a batch procedure according to another exemplary embodiment.

FIG. 38 to FIG. 45 show structures obtained during carrying out a method of manufacturing a plurality of packages in a batch procedure according to yet another exemplary embodiment.

FIG. 46 to FIG. 49 show structures obtained during carrying out a method of manufacturing a plurality of packages in a batch procedure according to still another exemplary embodiment.

DETAILED DESCRIPTION OF EXEMPLARY EMBODIMENTS

Figure 1:
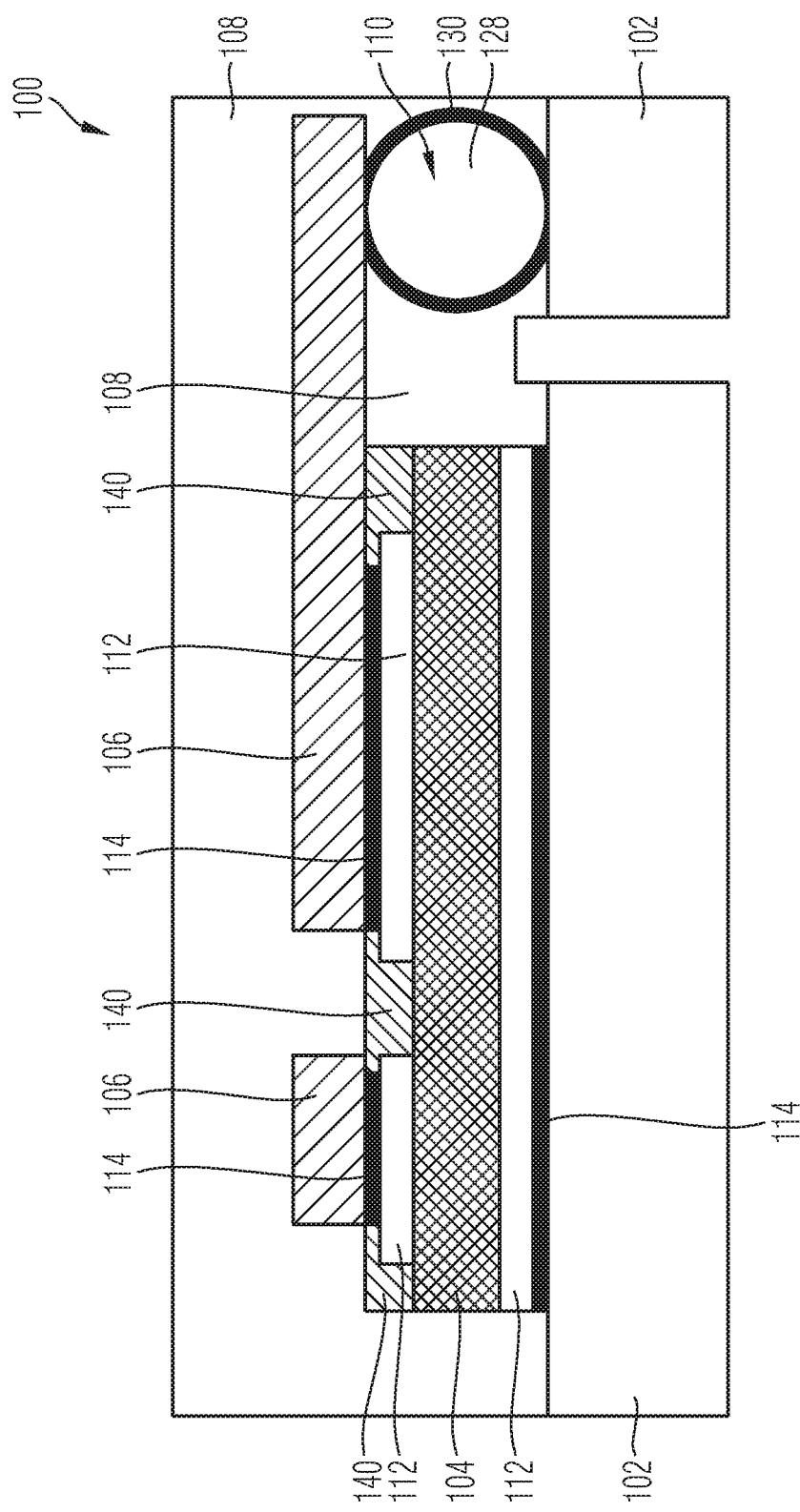
FIG. 1 illustrates a cross-sectional view of a package according to an exemplary embodiment.

The illustration in the drawing is schematically and not to scale.

Before exemplary embodiments will be described in more detail referring to the Figures, some general considerations will be summarized based on which exemplary embodiments have been developed.

According to an exemplary embodiment, a universal package architecture is provided. In particular, an exemplary embodiment of the invention may allow to simplify the assembly of clip packages.

At present, dedicated clips for almost every leadframe/chip combination are required. Also, many specific leadframe variants are required. The assembly is completed in several separate process steps. Current concepts use a widely dedicated set of materials (leadframe, clips, layout).

In contrast to this and in accordance with an exemplary embodiment, for a whole group of packages, the base materials can be unified to one leadframe material and one clip material and the assembly can be done in a batch process.

Hence, embodiments of the invention utilize a universal set of materials as chip carrier and front side interconnect. These materials may be structured to serve a group of chip types and sizes. The assembly may be molded. Dependent on the application, the front side contact may be exposed by grinding. Several options are possible to bridge between front side interconnect and leads. Using one universal leadframe base material and one universal clip base material, structuring both (to fit a range of chip sizes), and assembling both in combination with one or more power dies in one common process, a simple and efficient batch manufacturing procedure is provided. An advantage obtainable with such an embodiment is the replacement of a big range of base materials for leadframe and clip by one single base material. Furthermore, the package/clip combinations together with the die attach process may be advantageously designed to cover a range of chip sizes, significantly reducing the complexity and the supply inventory.

FIG. 1 illustrates a cross-sectional view of a package 100 according to an exemplary embodiment.

The semiconductor package 100 shown in FIG. 1 comprises a chip carrier 102 which is here embodied as a leadframe consisting of copper. An electronic chip 104, which is here embodied as a power semiconductor chip, is mechanically mounted on and electrically connected to the chip carrier 102. Although only a single electronic chip 104 is shown in the package 100 according to FIG. 1, it is also possible according to other exemplary embodiments to implement two or more semiconductor chips 104 in a single common package 100, so that the described architecture is compatible with multi-chip packages.

A clip 106, which consists in the described embodiment of a piece of a patterned copper foil, is mechanically mounted on and electrically coupled with the electronic chip 104.

An encapsulant 108, which is here embodied as a mold compound, encapsulates the electronic chip 104, partly the chip carrier 100, the clip 106, and an electrically conductive vertical connection structure 110. As can be taken from FIG. 1, connection structure 110 is provided as a separate body, i.e. separately from the clip 106 and separately from the chip carrier 102. The connection structure 110 provides for an electrically conductive connection between the chip carrier 102 and the clip 106 in a vertical direction according to FIG. 1. In view of the provision of the connection structure 110, no complex vertical connection accomplished by the clip 106 (which would require the implementation of a three-dimensional structure of the clip 106, conventionally with undercut and bent structure) is required. Consequently, a universally implementable preform of the clip 106 (see batch clip 124 as shown in FIG. 8) with simple structure and being compatible with a batch procedure can be used. As can be taken from FIG. 1, the connection structure 110 is configured as a ball with electrically conductive core 128 of copper and solderable shell 130 of tin, which together may also be denoted as copper core ball. Consequently, a solder connection may be established for mechanically and electrically connecting the connection structure 110 with the chip carrier 102 and the clip 106.

In the package 100, the electronic chip 104 and the connection structure 110 are arranged side by side between the chip carrier 102 and the clip 106. This results in a compact configuration in a vertical direction.

The electronic chip 104 is electrically connected to both the chip carrier 102 and the clip 106. More specifically, the electronic chip 104 has one chip pad 112 on a first main surface facing the chip carrier 102 and has two further chip pads 112 on an opposing second main surface facing the clip 106. Each of the chip pads 112 is covered with a solderable interconnect 114, for instance a diffusion solder material or a sintering paste. The pads 112 as well as the solderable interconnect 114 on the top side of the electronic chip 104 are embedded in a dielectric layer 140.

FIG. 2 is a plan view of a batch clip 124 according to an exemplary embodiment. The process chain according to a batch manufacturing procedure of manufacturing multiple packages 100 at the same time according to an embodiment of the invention utilizes a common base material for the chip carrier 102 (in particular leadframes) and clips 106. The base material(s) may be structured for instance by lithography and etching, as sketched in FIG. 3 and FIG. 4 for the clip frame or batch clip 124.

FIG. 3 is a cross-sectional view of a preform of batch clip 124 according to an exemplary embodiment. The preform according to FIG. 3 is an electrically conductive foil 142, for instance a copper foil, which is covered with a patterned mask 144 on both main surfaces thereof.

FIG. 4 is a cross-sectional view of another preform of the batch clip 120 according to an exemplary embodiment. Starting from the preform according to FIG. 3, an etching procedure is carried out from both opposing main surfaces of this preform so that through holes 146 as well as blind holes 148 are formed in the foil 142, thereby obtaining the batch clip 124 (after stripping mask 144).

FIG. 5 is a plan view of a batch clip 124 with a frame structure 131 according to an exemplary embodiment which can be manufactured with a corresponding procedure as described referring to FIG. 3 and FIG. 4.

FIG. 6 is a plan view of a batch carrier 120 with frame structure 132 according to an exemplary embodiment.

The batch carrier 120 or leadframe may be structured in accordance with the structuring of the batch clip 124 (compare the manufacturing procedure described referring to FIG. 3 and FIG. 4).

FIG. 7 to FIG. 15 show structures obtained during carrying out a method of manufacturing a plurality of packages 100 in a batch procedure according to an exemplary embodiment. A corresponding process chain may use solderable material of interconnect 114 deposited on the front side and the backside of the electronic chip 104. In this embodiment, a clip-to-leadframe interconnect (i.e. an interconnect between chip carriers 102 and clips 106) may be accomplished by a metal core solder ball as connection structure 110 (compare FIG. 1).

Referring to FIG. 7, a first metal sheet 148 (such as a first copper foil) and a usually thinner second metal sheet 150 are provided. Metal sheets 148, 150 may have a dimension of at least 1000 cm² and may serve as base material for forming a universal leadframe (batch carrier 120) and of a universal clip frame (batch clip 124).

Referring to FIG. 8, metal sheets 148, 150 may be patterned by half etching to thereby form the batch carrier 120 and the clip carrier 124. The batch carrier 120 is composed of a plurality of chip carrier sections 122. The clip carrier 124 is composed of a plurality of clip sections 126. As can be taken from FIG. 8, the batch clip 124 is provided with a simple structure and is more specifically embodied as a substantially two-dimensional electrically conductive sheet without undercuts or the like. The batch clip 124 has a profiled bottom surface facing the carrier clip 120 and has an opposing upper planar surface. The batch carrier 120 has a profiled bottom surface and has an opposing upper planar surface.

The open-worked areas (for instance space between the die pads) may be manufactured using a double side open mask to create a local complete separation of the base material by a double half-etch. The half-etched areas for the later separation of for example the leads or separate front side clips 106 only need a one-sided open mask layer. For a faster separation after the soldering process, it is also possible that the etching is more than a half etch in order to speed up the subsequent separation of the individual features.

Referring to FIG. 9, a plurality of electronic chips 104 are arranged on the batch carrier 120 so that each of the electronic chips 104 is assigned to a respective one of the chip carrier sections 122. Accordingly, the plurality of clip sections 126 of the batch clip 124 are arranged on the electronic chips 104 so that each of the electronic chips 104 is assigned to a respective one of the clip sections 126.

Furthermore, a plurality of electrically conductive vertical connection structures 110, here configured as copper core balls as described referring to FIG. 1, are provided as structures being separate from the batch clip 124 and separate from the batch carrier 120. Each of the connection structures 110 is used to electrically connect a respective one of the chip carrier sections 122 with a respective one of the clip sections 126.

A solderable interconnect 114 covers all three pads 112 of each of the electronic chips 104 to provide later on an electric connection between the electronic chip 104 and the clip 106 as well as between the electronic chip 104 and the chip carrier 102. The material of the interconnects 114 on the front side is structured according to the pad structure so as to cover a respective pad 112. The electronic chips 104 are singulated. The material of the interconnects 114 (which may be a diffusion solder or a sintering paste) may be deposited on chip front side and chip back side.

Referring to FIG. 10, a semifinished product 116 according to an exemplary embodiment is shown which is composed of a plurality of preforms 118 of packages 100.

The semifinished product 116 is manufactured by electrically connecting each of the connection structures 110 between a respective one of the chip carrier sections 122 and a respective one of the clip sections 126. As can be taken from a comparison of FIG. 9 and FIG. 10, this connecting procedure is carried out simultaneously with a further connecting procedure between the electronic chip 104 on the one hand and the chip carrier 102 and the clip 106 on the other hand. More specifically, the electronic chip 104 and the clip 106 are connected by soldering the solderable interconnect 114 covering the pads 112 of the electronic chip 104 between the electronic chip 104 and the clip 106. The simultaneous connection procedure may be accomplished by the application of mechanical pressure and heat.

In terms of such a manufacturing procedure, the individual electronic chips 104 (with their pads 112, the interconnects 114, and the dielectric layer 140 described referring to FIG. 1) are placed on the leadframe-type batch carrier 120 (optionally with a temporary fixation by a die attach liquid, not shown). The connection structures 110 embodied as copper core solder ball with solderable surface are placed, one for each separate connection, on the batch carrier 120 to bridge the connection between the front side batch clip 124 and the related leads on the leadframe-type batch carrier 120, also optionally fixed temporarily with for example a die attach liquid or a flux material (not shown). The clip frame or batch clip 124 is placed on top of the formerly described assembly. The diameter of the copper core balls as connection structures 110 may be selected according to a respective chip thickness (including metalizations). The clip frame or batch clip 124 and the leadframe or batch carrier 120 may preferably be adjusted and fixed against each other with for example alignment pins on the frame edge (not shown). The assembly is then subjected to a heated press or an appropriate furnace to create front side and back side and solder ball interconnects at the same time.

Referring to FIG. 11 and as indicated by arrows 154, the interconnected assembly according to FIG. 10 may be subsequently thinned (for instance by grinding) from the front side to separate the different front side interconnects. Thus, the manufacturing procedure separates the clip sections 126 from one another by removing interconnecting material of the batch clip 124 by grinding. In other words, the front side contacts are separated by grinding from the clip side.

Referring to FIG. 12, after the described grinding procedure, the obtained assembly is them encapsulated, for example by transfer molding. As can be taken from FIG. 12, the electronic chips 104, the separated batch clip 124, and the batch carrier 120 are fully or partially encapsulated by mold-type encapsulant 108.

Referring to FIG. 13, and as indicated by arrows 156, the individual leadframe structures or chip carrier sections 122 (i.e. leads, die pad(s)) are then separated by etching from the leadframe back side. The front side of the frame, the separated batch clip 124 and the electronic chips 104 are protected by the encapsulant 108 (or can be protected for example by a mask or a tape in case of an exposed embodiment). By this procedure, the chip carrier sections 122 are separated from one another by etching away material from the bottom side of the batch carrier 120. Thus, the leads are separated from the die-pads by etching.

Referring to FIG. 14, the die pads and leads are now separated, and the individual packages 100 are only stuck together by the encapsulant 108. The packages 100 can then be separated from one another into individual packages 100 by (in particular mechanically) dicing in dicing regions 160. Thus, the manufacturing method further comprises singularizing an obtained semifinished product 116 into singularized packages 100, each comprising at least one chip carrier section 122, at least one electronic chip 104, at least one clip section 126 and at least one connection structure 110.

Referring to FIG. 15, showing the singularized packages 100 after dicing, as the leadframe material has been removed by etching already, only mold compound needs to be diced in the stage according to FIG. 14, significantly simplifying the process. In the state according to FIG. 15, the individual packages 100 are finished.

FIG. 16 show a structure obtained during carrying out a method of manufacturing a plurality of packages 100 in a batch procedure with an additional procedure to be carried out between the stages according to FIG. 12 and FIG. 13. In order to obtain the structure according to FIG. 16, material of the encapsulant 108 is removed from the top side by grinding or etching to thereby expose upper main surfaces of the electrically conductive clips 106. This improves the heat removal capability of the packages 100 which can be manufactured accordingly. For a double sided cooling (i.e. exposed clips 106), grinding the mold compound can be performed until the clips 106 are exposed. Alternatively, the molding may be done with tape, then the additional grinding procedure may be dispensable. In packages 100 obtained based on the structure shown in FIG. 16, both the chip carrier 102 and the clip 106 have a main surface portion exposed with regard to the encapsulant 108.

FIG. 17 and FIG. 18 shows structures obtained during carrying out a method of manufacturing a plurality of packages 100 in a batch procedure according to yet another exemplary embodiment. This alternative embodiment relates to a process chain of a variant in which clip interconnect material (compare reference numeral 114) is deposited on clip frame or batch clip 124 rather than on chip pads 112 as in the embodiment of FIG. 7 to FIG. 15.

Referring to FIG. 17, the profiled lower main surface of the batch clip 124 facing the batch carrier 120 is provided at parts of the shown protrusions with a layer of material of the interconnects 114 (which may be a diffusion solder or a sintering paste). Thus, solder may be pre-plated on the batch clip 124. The surface area of the main surface of the batch clip 124 facing the batch carrier 120 being covered with the material of the interconnect 114 may correspond to the position of the two chip pads 112 on the upper main surface of the electronic chips 104, compare FIG. 18.

Referring to FIG. 18, the interconnects 114 may then connect the chip pads 112 with the batch clip 124 (compare the double arrows in FIG. 18).

The further manufacturing procedure can then be as described above referring to FIG. 10 to FIG. 16).

Figure 19:
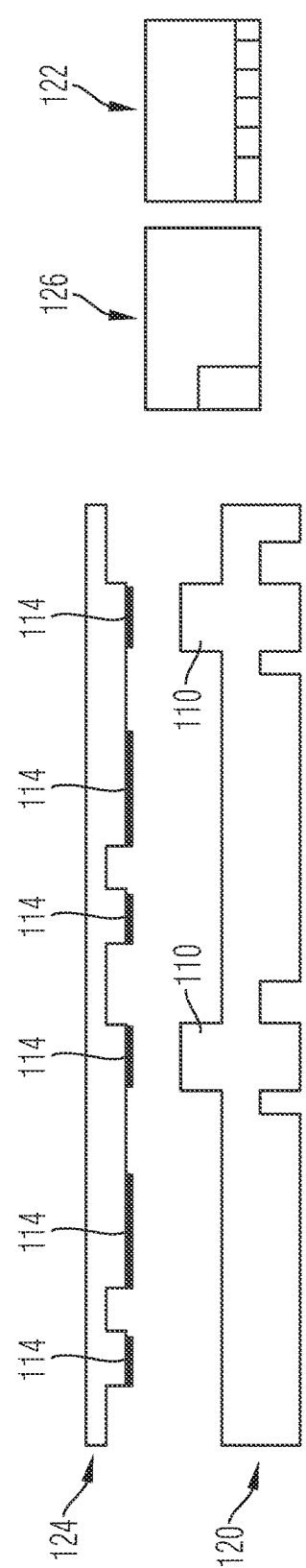
FIG. 19 to FIG. 21 shows structures obtained during carrying out a method of manufacturing a plurality of packages in a batch procedure according to still another exemplary embodiment.
Figure 20:
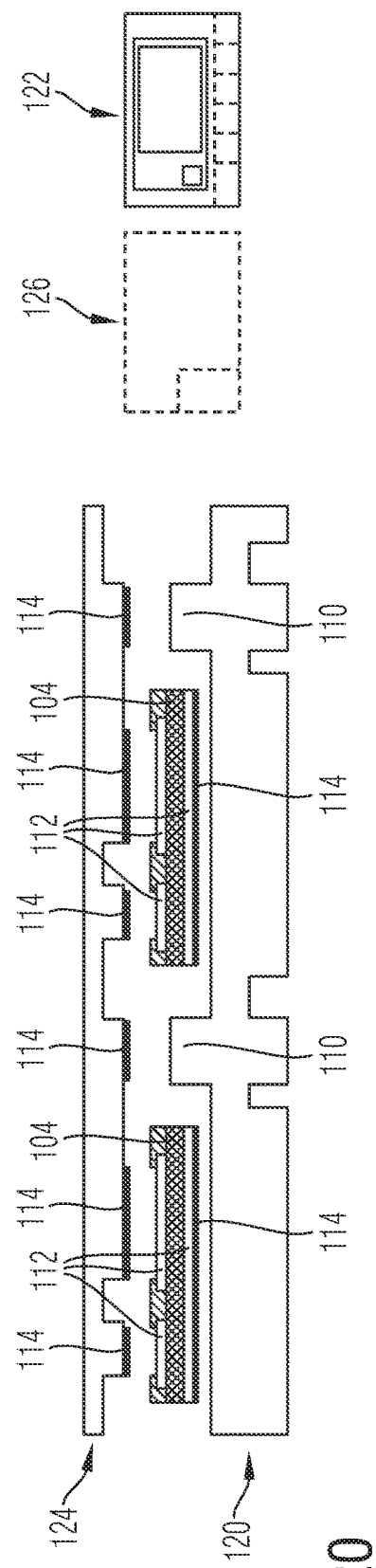
Figure 21:
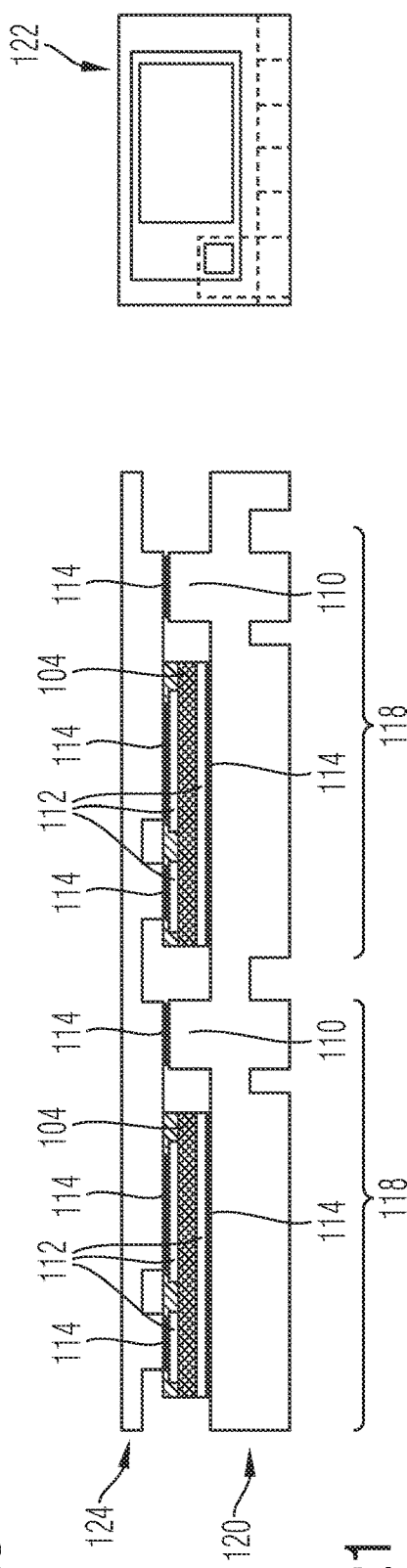

FIG. 19 to FIG. 21 shows structures obtained during carrying out a method of manufacturing a plurality of packages 100 in a batch procedure according to still another exemplary embodiment. FIG. 19 to FIG. 21 corresponds to a process chain of another embodiment in which the clip-to-leadframe interconnect is realized by structuring the leadframe on both sides. As in FIG. 17 and FIG. 18, clip interconnect material is deposited on clip frame or batch clip 124. Thus, in the described embodiment, the connection structure 110 forms part of the chip carrier 102 and is configured as protrusions extending upwardly beyond the main surface of the batch carrier 120 facing the clip carrier 124.

Referring to FIG. 19, integrally forming the connection structures 110 with the batch carrier 120, i.e. as protrusions extending from an otherwise planar main surface thereof, reduces the number of parts to be handled during assembly and therefore simplifies the manufacturing procedure. As can be taken from FIG. 19, the profiled lower main surface of the batch clip 124 is provided with material of the interconnects 114 additionally at a position where the protrusions forming the connection structures 110 later on will contact the batch clip 124.

Referring to FIG. 20, the electronic chips 104 with the pads 112 but without material of the interconnect 114 are then placed between the batch carrier 120 and the batch clip 124 according to FIG. 19.

Referring to FIG. 21, mutual electric connections between electronic chip 104 and batch carrier 120, electronic chip 104 and batch clip 124, as well as between batch carrier 120 and batch clip 124 are established simultaneously by soldering the interconnects 114.

Figure 22:
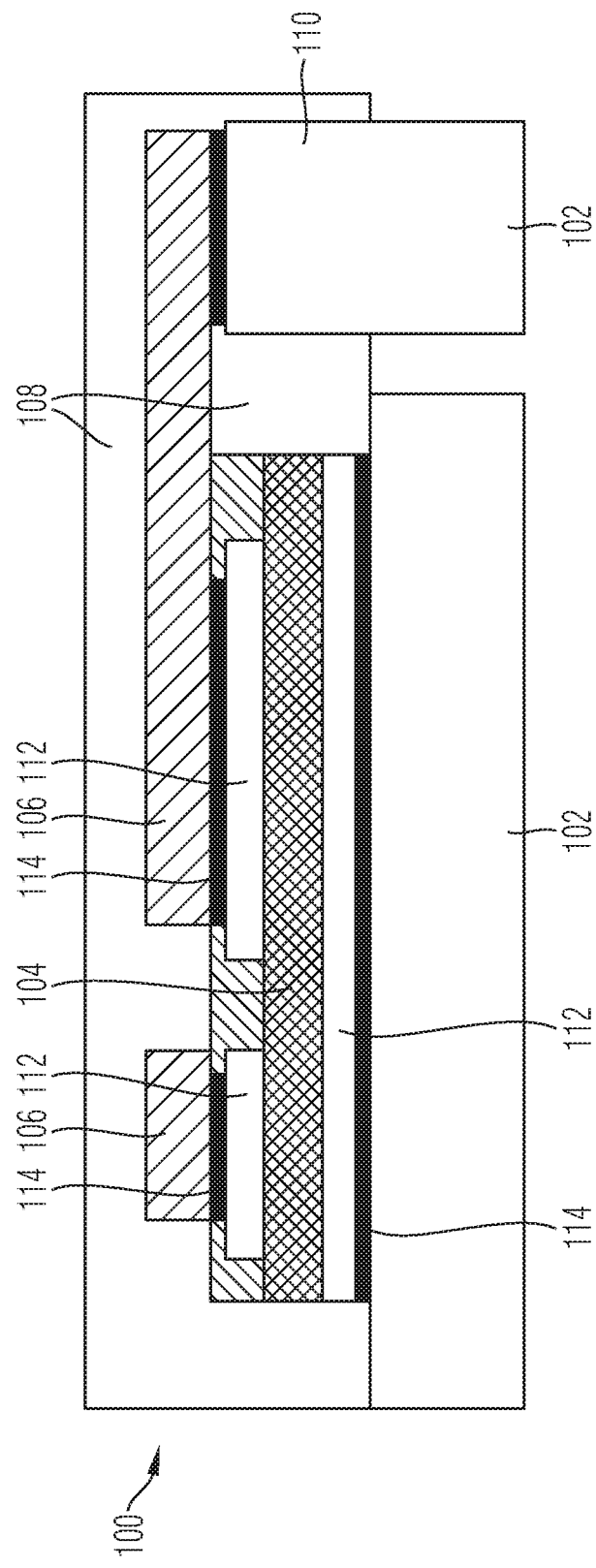
FIG. 22 illustrates a cross-sectional view of a package according to an exemplary embodiment obtained by the manufacturing procedure according to FIG. 19 to FIG. 21.

In order to complete formation of packages 100 with the batch manufacturing procedure according to FIG. 19 to FIG. 21, the structure according to FIG. 21 may be made subject to a treatment corresponding to FIG. 11 to FIG. 16. After singularization, packages as shown in FIG. 22 can be obtained. FIG. 22 hence illustrates a cross-sectional view of a package 100 according to an exemplary embodiment obtained by the manufacturing procedure according to FIG. 19 to FIG. 21.

FIG. 23 to FIG. 25 illustrate cross-sectional views and plan views of packages 100 according to exemplary embodiments.

Dependent on the assembly route and the product requirements, all three variants produce substantially the same outer package layout and can be manufactured either as a package 100 with an exposed front side contact (for instance for a double side cooling application) or as a molded package 100.

Referring to FIG. 23, a package 100 with an encapsulant 108 on top of clip 106 is shown on the left-hand side corresponding to FIG. 1. On the right-hand side of FIG. 23, a package 100 with exposed clip 106 is shown for double-sided cooling which can be obtained by singularizing the structure shown in FIG. 16.

Referring to FIG. 24, the left-hand side shows a package 100 similar to the package 100 on the left hand side of FIG. 23 with the exception that the copper core ball as connection structure 110 is substituted by another connection structure 110 configured as an electrically conductive block covered with a layer of solderable interconnect 114 on both opposing main surfaces thereof (for instance a both sided metallized copper spacer). The right hand side of FIG. 24 shows a package 100 which differs from the package 100 on the left-hand side in that material of the encapsulant 108 has been removed from the top to thereby expose an upper main surface of the clip 106.

Referring to FIG. 25, the electrically conductive block covered with a layer of solderable interconnect 114 on both opposing main surfaces thereof according to FIG. 24 is substituted by a protrusion of the chip carrier 102 covered with a layer of solderable interconnect 114 on the exposed top surface thereof. This embodiment of the connection structure 110 corresponds to the manufacturing methods described referring to FIG. 19 to FIG. 22.

Figure 26:
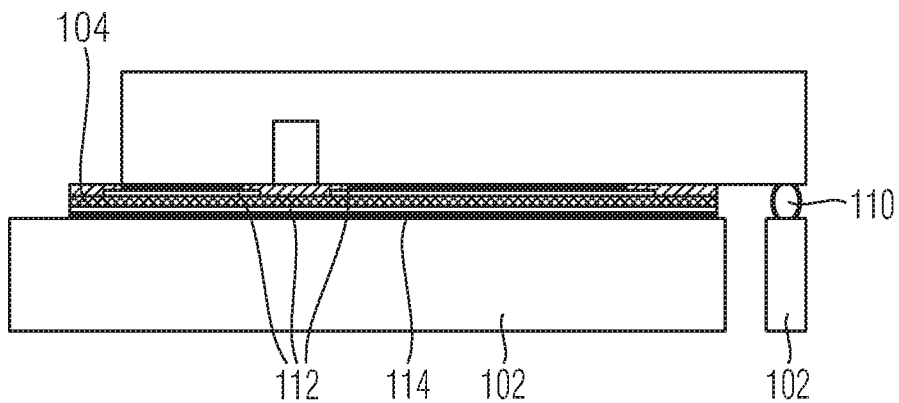
FIG. 26 shows a preform of a package and FIG. 27 shows a package according to an exemplary embodiment roughly to scale.
Figure 27:
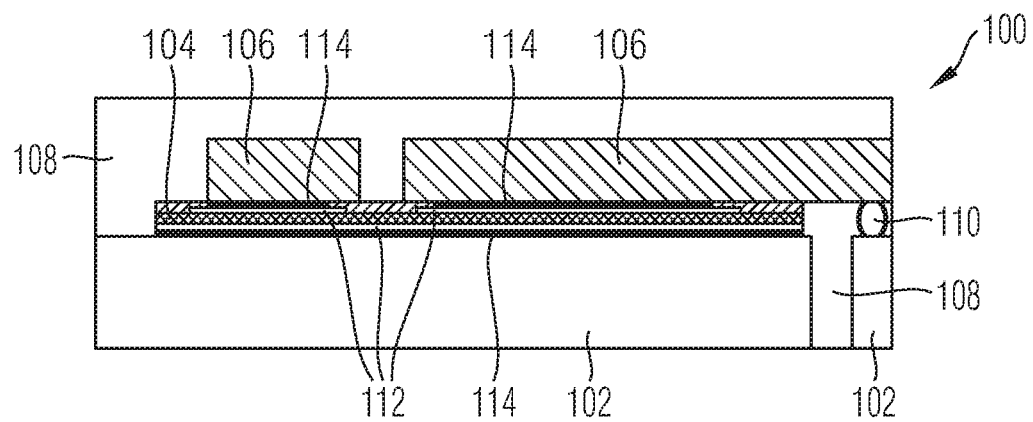

FIG. 26 shows a preform of a package 100 (before encapsulating) and FIG. 27 shows a readily manufactured encapsulated package 100 according to an exemplary embodiment roughly to scale. The electronic chip 104 may have a vertical thickness of for example 60 μm. The chip carrier 102 may have a vertical thickness of for example 200 μm. The batch clip 124 may initially have a vertical thickness of for example 200 μm. The copper core ball as vertical connection structure 110 may have a vertical thickness of for example 60 μm. An etch depth may correspond to an etch width.

FIG. 28 to FIG. 37 show structures obtained during carrying out a method of manufacturing a plurality of packages 100 in a batch procedure according to another exemplary embodiment. According to the described embodiment, leadframe separation may be accomplished by grinding.

Referring to FIG. 28, the shown structure corresponds to FIG. 7.

Referring to FIG. 29, the shown structure corresponds to FIG. 8 with the difference that, according to FIG. 29, the batch carrier 120 has a profiled surface facing the profiled surface of the batch clip 124. Thus, the profiled surface and the planar surface of the batch carrier 120 have been exchanged when comparing FIG. 29 with FIG. 8.

Referring to FIG. 30, the taken measures correspond to the measures taken according to FIG. 9.

Referring to FIG. 31, the taken measures correspond to the measures taken according to FIG. 10.

Figure 32:
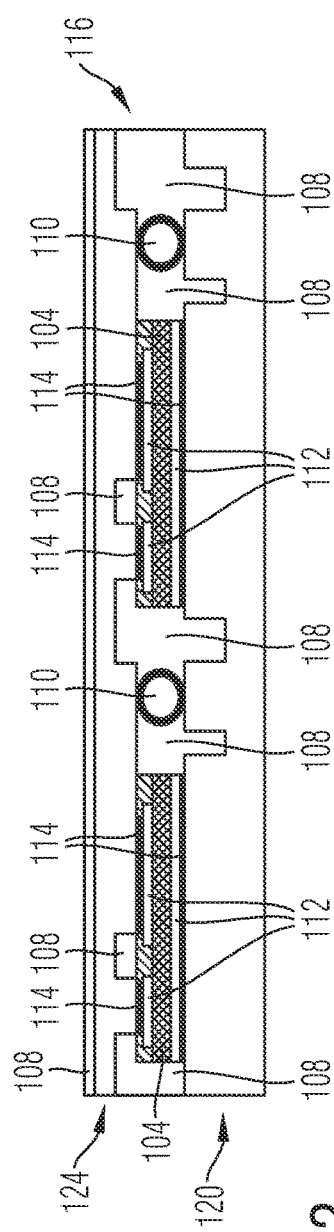

Referring to FIG. 32, the structure according to FIG. 31 is encapsulated by an encapsulant 108 prior to separating the batch clip 124 into separate clips 106.

Figure 33:
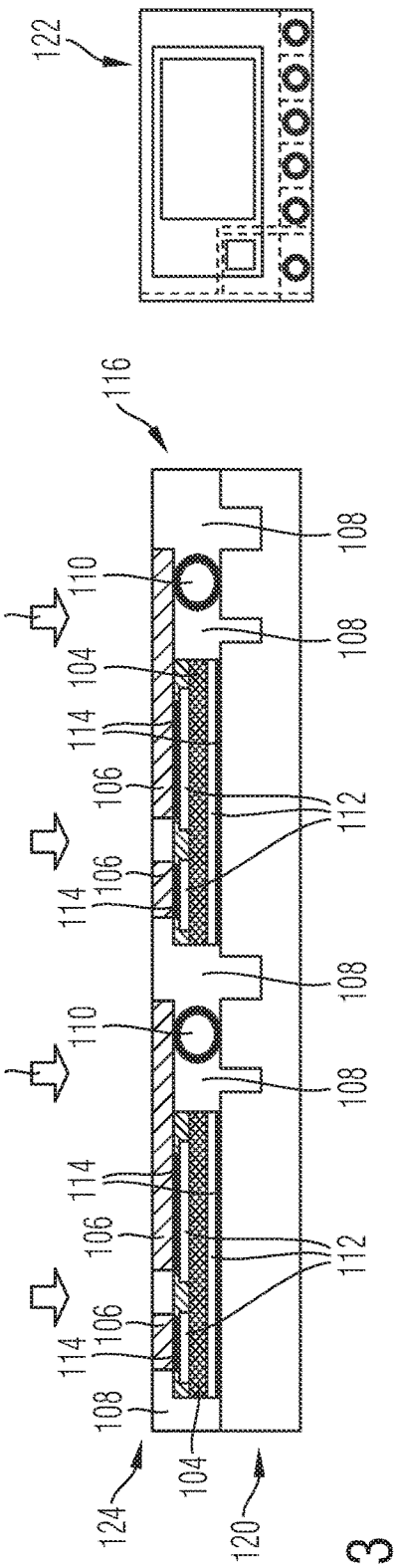

Referring to FIG. 33, material of the encapsulant 108 and of the batch clip 124 is removed from an upper surface of the structure according to FIG. 32 by grinding to thereby separate the batch clip 124 into separate clips 106. Thus, removing material of the batch clip 124 is done after encapsulating. This has the advantage that the material of the encapsulant 108 mechanically supports the half etched metal foil constituting the batch clip 124 during grinding.

Figure 34:
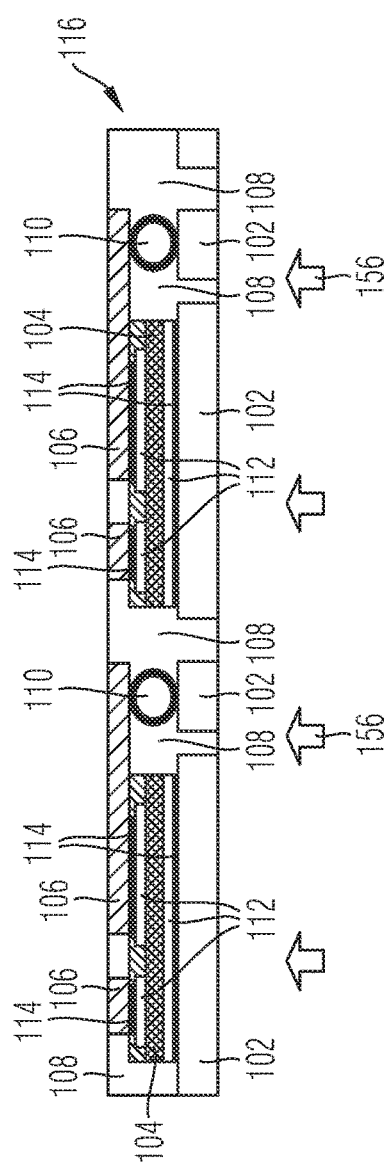

Referring to FIG. 34, material of the batch carrier 120 is removed by grinding from the backside. Since the batch carrier 120 has its profiled surface facing the profiled surface of the batch clip 124, separation of the individual chip carriers 102 may be accomplished by grinding.

Referring to FIG. 35, the obtained structure substantially corresponds to the structure shown in FIG. 13 with the exception that the recesses in and between the chip carriers 102 are filled with material of the encapsulant 108 according to FIG. 35, and are empty according to FIG. 13.

Referring to FIG. 36, the packages 100 may be separated by dicing to thereby obtain the individual packages 100 shown in FIG. 37.

FIG. 38 to FIG. 45 show structures obtained during carrying out a method of manufacturing a plurality of packages 100 in a batch procedure according to still another exemplary embodiment. This embodiment can be denoted to correspond to a "leadframe mold first, grind second" principle.

The structures shown in FIG. 38, FIG. 39 and FIG. 40 correspond to the structures shown in FIG. 8, FIG. 9, and FIG. 10, respectively.

Referring to FIG. 41, the structure according to FIG. 40 is encapsulated by an encapsulant 108.

Referring to FIG. 42, the structure according to FIG. 41 is subjected to a grinding procedure to remove material of the encapsulant 108 and of the batch clip 124 to thereby separate the individual clips 106. The material of the encapsulant 108 mechanically supports the sensitive batch clip 124 during grinding.

Referring to FIG. 43, the chip carriers 102 are separated from one another by etching away material of the batch carrier 120 from the backside.

Referring to FIG. 44, the so connected packages 100 are separated from one another by dicing. FIG. 45 illustrates the obtained singularized packages 100.

FIG. 46 to FIG. 49 show structures obtained during carrying out a method of manufacturing a plurality of packages 100 in a batch procedure according to yet another exemplary embodiment. In this embodiment, the individual clips 106 exposed during separating the individual clips 106 based on the previous batch clip 124 can be embedded in further encapsulation material by an additional encapsulating procedure. In other words, the clips 106 can be covered on the front side.

Referring to FIG. 46, the structure obtained after having carried out the procedure described above referring to FIG. 42 can be made subject to a further encapsulation procedure by encapsulating the exposed upper main surfaces of the clips 106 by an additional encapsulant 108.

The procedures according to FIG. 47, FIG. 48 and FIG. 49 then correspond to the procedures according to FIG. 43, FIG. 44 and FIG. 45, as described above.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
a chip carrier;
an electronic chip on the chip carrier;
a clip on the electronic chip;
an encapsulant at least partially encapsulating the electronic chip;
an electrically conductive vertical connection structure provided separately from the clip and electrically connecting the chip carrier with the clip, wherein the electronic chip and the connection structure are arranged side by side between the chip carrier and the clip and are spaced apart from each other by a void space,
wherein the void space between the electrically conductive vertical connection structure and the electronic chip is filled by the encapsulant,
wherein both the chip carrier and the clip have at least a surface portion exposed with regard to the encapsulant,
wherein the surface portion of the chip carrier onto which the electronic chip is arranged is a planar surface,
wherein the connection structure is a structure being separate from the clip and the chip carrier,
wherein a surface portion of the clip being connected to the chip and the connection structure is a planar surface such that the connection structure bridges the distance between the planar surface portion of the clip being connected to the chip and the connection structure and the planar surface portion of the chip carrier onto which the electronic chip is arranged,
wherein the electronic chip has at least one chip pad on a main surface of the chip,
wherein the chip pad is covered with a solderable interconnect,
wherein the pad, the solderable interconnect and the complete main surface are embedded in a dielectric layer while keeping the solderable interconnect uncovered, so as to provide a further planar surface for abutting the planar surface portion of the clip.

2. The package according to claim 1, wherein the electronic chip is electrically connected to at least one of the chip carrier and the clip.

3. The package according to claim 1 wherein the solderable interconnect is at least one of a diffusion solder material and a sintering paste.

4. A semifinished product composed of a plurality of preforms of packages, the semifinished product comprising:
a batch carrier comprising a plurality of chip carrier sections;
a plurality of electronic chips arranged on the batch carrier so that each of the electronic chips is assigned to a respective one of the chip carrier sections;
a batch clip comprising a plurality of clip sections and being arranged on the electronic chips so that each of the electronic chips is assigned to a respective one of the clip sections;
a plurality of electrically conductive vertical connection structures provided separately from the batch clip, wherein each of the connection structures electrically connects a respective one of the chip carrier sections with a respective one of the clip sections,
wherein at least one of the plurality of electronic chips and at least one of the plurality of connection structures are arranged side by side between the at least one of the chip carrier section and the one of the plurality of clips and are spaced apart from each other by a void space,
an encapsulant encapsulating at least partially the electronic chips, the batch clip and the batch carrier,
wherein the void space between the electrically conductive vertical connection structures and the electronic chip is filled by the encapsulant,
wherein both the chip carriers and the clips have at least a surface portion exposed with regard to the encapsulant,
wherein the surface portion of the batch chip carrier onto which the electronic chips are arranged is a planar surface,
wherein the connection structures are a structure being separate from the batch clip and the batch chip carrier,
wherein a surface portion of the batch clip sections being connected to the respective chips and the connection structures is a planar surface such that the connection structures bridge the distance between the planar surface portions of the batch clip sections being connected to the chip and the connection structures and the planar surface portion of the batch chip carrier onto which the electronic chips are arranged,
wherein each of the electronic chips has at least one chip pad on a respective main surface of the chip,
wherein the chip pad is covered with a solderable interconnect,
wherein the pad, the solderable interconnect and the complete main surface are embedded in a dielectric layer while keeping the solderable interconnect uncovered, so as to provide a further planar surface for abutting the planar surface portion of the clip.

5. The semifinished product according to claim 4, wherein the batch clip is configured as a substantially two-dimensional electrically conductive sheet.

6. The semifinished product according to claim 4, wherein at least one of the batch carrier and the batch clip has a dimension of at least 100 cm$^2$, in particular of at least 1000 cm$^2$.

7. The semifinished product according to claim 4, wherein at least one of the batch carrier and the batch clip is free of undercuts.

8. The semifinished product according to claim 4, wherein the batch clip has a profiled surface facing the electronic chips and has an opposing planar surface.

9. The semifinished product according to claim 4, wherein the batch carrier has a profiled surface.

10. A method of manufacturing a package, the method comprising:
mounting an electronic chip on a chip carrier;
mounting a clip on the electronic chip;
electrically connecting the chip carrier with the clip by an electrically conductive vertical connection structure provided separately from the clip; and
at least partially encapsulating the electronic chip by an encapsulant, wherein the electronic chip and the connection structure are arranged side by side between the chip carrier and the clip and are spaced apart from each other by a void space,
wherein the void space between the electrically conductive vertical connection structure and the electronic chip is filled by the encapsulant,
wherein both the chip carrier and the clip have at least a surface portion exposed with regard to the encapsulant,
wherein the surface portion of the chip carrier onto which the electronic chip is arranged is a planar surface,
wherein the connection structure is a structure being separate from the clip and the chip carrier,
wherein a surface portion of the clip being connected to the chip and the connection structure is a planar surface such that the connection structure bridges the distance between the planar surface portion of the clip being connected to the chip and the connection structure and the planar surface portion of the chip carrier onto which the electronic chip is arranged,
wherein the electronic chip has at least one chip pad on a main surface of the chip,
covering the chip pad with a solderable interconnect,
embedding the pad, the solderable interconnect and the complete main surface in a dielectric layer while keeping the solderable interconnect uncovered, so as to provide a further planar surface for abutting the planar surface portion of the clip.

11. The method according to claim 10, wherein the connecting is accomplished by the application of at least one of mechanical pressure and heat.

12. A method of manufacturing a batch of packages, the method comprising:
providing a batch carrier comprising a plurality of chip carrier sections;
arranging a plurality of electronic chips on the batch carrier so that each of the electronic chips is assigned to a respective one of the chip carrier sections;
arranging a batch clip, which comprises a plurality of clip sections, on the electronic chips so that each of the electronic chips is assigned to a respective one of the clip sections;
providing a plurality of electrically conductive vertical connection structures separately from the batch clip;
electrically connecting each of the connection structures between a respective one of the chip carrier sections and a respective one of the clip sections,
at least partially encapsulating at least one of the group consisting of the electronic chips, the batch clip, and the batch carrier by an encapsulant, wherein at least one of the plurality of electronic chips and at least one of the plurality of connection structures are arranged side by side between the at least one of the chip carrier section and the one of the plurality of clips and are spaced apart from each other by a void space, wherein the void space between the electrically conductive vertical connection structures and the electronic chip is filled by the encapsulant, wherein both the chip carriers and the clips have at least a surface portion exposed with regard to the encapsulant, wherein the surface portion of the batch chip carrier onto which the electronic chips are arranged is a planar surface, wherein the connection structures are a structure being separate from the batch clip and the batch chip carrier, wherein a surface portion of the batch clip sections being connected to the respective chips and the connection structures is a planar surface such that the connection structures bridge the distance between the planar surface portions of the batch clip sections being connected to the chip and the connection structures and the planar surface portion of the batch chip carrier onto which the electronic chips are arranged, wherein the electronic chips have at least one chip pad on respective main surfaces of the chips, covering the respective chip pads with a solderable interconnect, embedding the pads, the solderable interconnect and the complete main surfaces in a dielectric layer while keeping the solderable interconnect uncovered, so as to provide a further planar surface for abutting the planar surface portion of the batch clip.

13. The method according to claim 12, wherein the method comprises singularizing an obtained semifinished product into singularized packages, each comprising at least one chip carrier section, at least one electronic chip, at least one clip section and at least one connection structure.

14. The method according to claim 12, wherein at least one of the batch carrier and the clip carrier is formed by half etching an electrically conductive sheet.

15. The method according to claim 12, wherein the method comprises separating the clip sections from one another by removing, in particular by grinding or etching, material of the batch clip, in particular simultaneously with removing material of the encapsulant.

16. The method according to claim 12, wherein the method comprises separating the chip carrier sections from one another by removing, in particular by grinding or etching, material of the batch carrier.

17. The method according to claim 12, wherein the connecting is carried out simultaneously with a further connecting between the electronic chip and at least one of the chip carrier and the clip.

18. The method according to claim 12, wherein the method further comprises connecting the electronic chip and the clip by soldering a solderable interconnect, covering one of the electronic chip and the batch clip, between the electronic chip and the clip.

19. The method according to claim 15, wherein at least part of the removing is done after encapsulating.

20. The method according to claim 15, wherein at least part of the removing is done before encapsulating.

* * * * *